United States Patent
Park et al.

(10) Patent No.: US 7,462,895 B2
(45) Date of Patent: Dec. 9, 2008

(54) SIGNAL LINE FOR DISPLAY DEVICE AND THIN FILM TRANSISTOR ARRAY PANEL INCLUDING THE SIGNAL LINE

(75) Inventors: Hong-Sick Park, Gyeonggi-do (KR); Shi-Yul Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/296,603

(22) Filed: Dec. 6, 2005

(65) Prior Publication Data

US 2006/0267014 A1  Nov. 30, 2006

(30) Foreign Application Priority Data

Dec. 6, 2004  (KR) ...................... 10-2004-0101916

(51) Int. Cl.
*H01L 29/10* (2006.01)
(52) U.S. Cl. .................... 257/211; 257/208; 257/57; 257/66; 257/E21.574; 257/E27.081
(58) Field of Classification Search ........................ None
See application file for complete search history.

(56) References Cited

U.S. PATENT DOCUMENTS 5,844,274 A * 12/1998 Tsutsumi .................... 257/333

2004/0051103 A1 * 3/2004 Hong et al. .................... 257/72

FOREIGN PATENT DOCUMENTS

| JP | 2003-342653 | 12/2003 |
|---|---|---|
| JP | 2004-091907 | 3/2004 |
| JP | 2004-140319 | 5/2004 |
| JP | 2004-163901 | 6/2004 |
| KR | 1020000057733 | 9/2000 |
| KR | 100303141 | 7/2001 |
| KR | 1020040040929 | 5/2004 |

OTHER PUBLICATIONS

English Language Abstract, KR Patent First Publication No. 1020000057733, Sep. 25, 2000, 1 page.

(Continued)

*Primary Examiner*—Evan Pert
*Assistant Examiner*—Scott R Wilson
(74) *Attorney, Agent, or Firm*—Alma P. Levy; MacPherson Kwok Chen & Heid LLP

(57) ABSTRACT

A thin film transistor (TFT) array panel with signal lines that have low resistivity is presented. The TFT array panel includes an insulating substrate, a gate line formed on the insulating substrate, a gate insulating layer formed on the gate line, a drain electrode and a data line having a source electrode formed on the gate insulating layer, the drain electrode facing the source electrode with a gap, and a pixel electrode connected to the drain electrode. In one embodiment, at least one of the gate line, the data line, and the drain electrode includes a first conductive layer made of a Mo-containing conductor, a second conductive layer made of a Cu-containing conductor, and a third conductive layer made of a MoN-containing conductor.

8 Claims, 22 Drawing Sheets

OTHER PUBLICATIONS

English Language Abstract, JP Patent First Publication No. 2004-140319, May 13, 2004, 1 page.
English Language Abstract, JP Patent First Publication No. 2004-163901, Jun. 10, 2004, 1 page.
English Language Abstract, KR Patent First Publication No. 1020040040929, May 13, 2004, 1 page.
English Language Abstract, KR Patent First Publication No. 100303141, Jul. 9, 2001, 1 page.
English Language Abstract, JP Patent First Publication No. 2003-342653, Dec. 3, 2003, 1 page.
English Language Abstract, JP Patent First Publication No. 2004-091907, Mar. 25, 2004, 1 page.

* cited by examiner

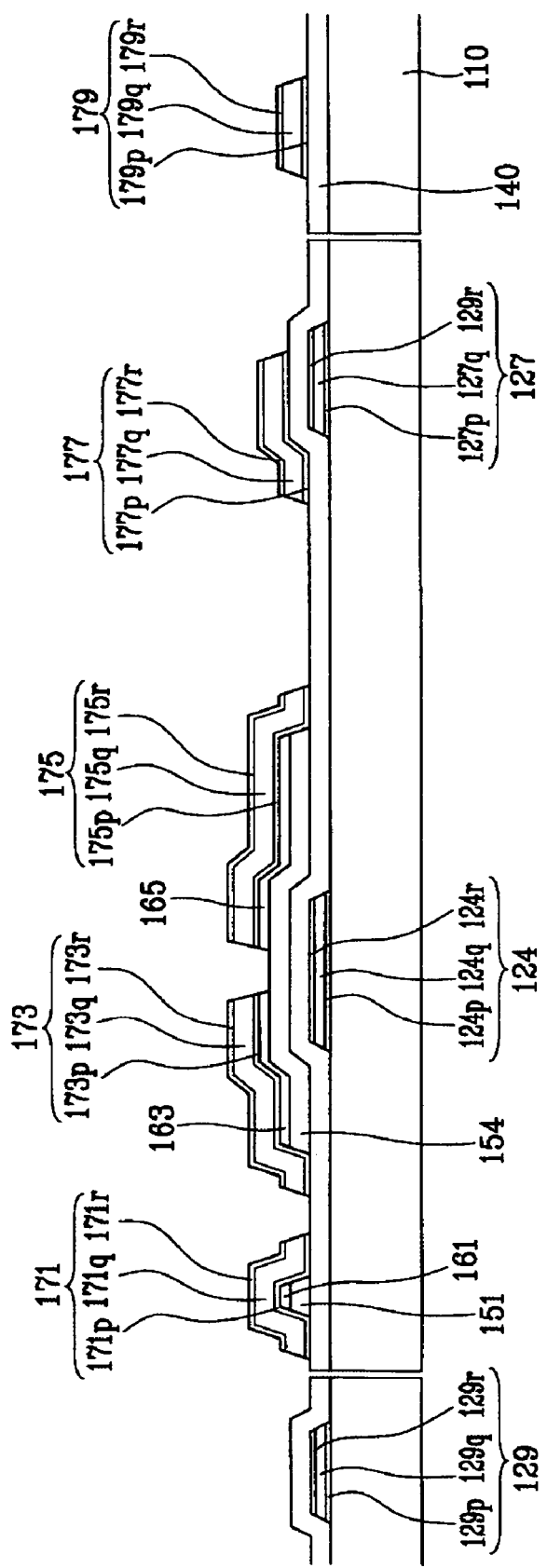

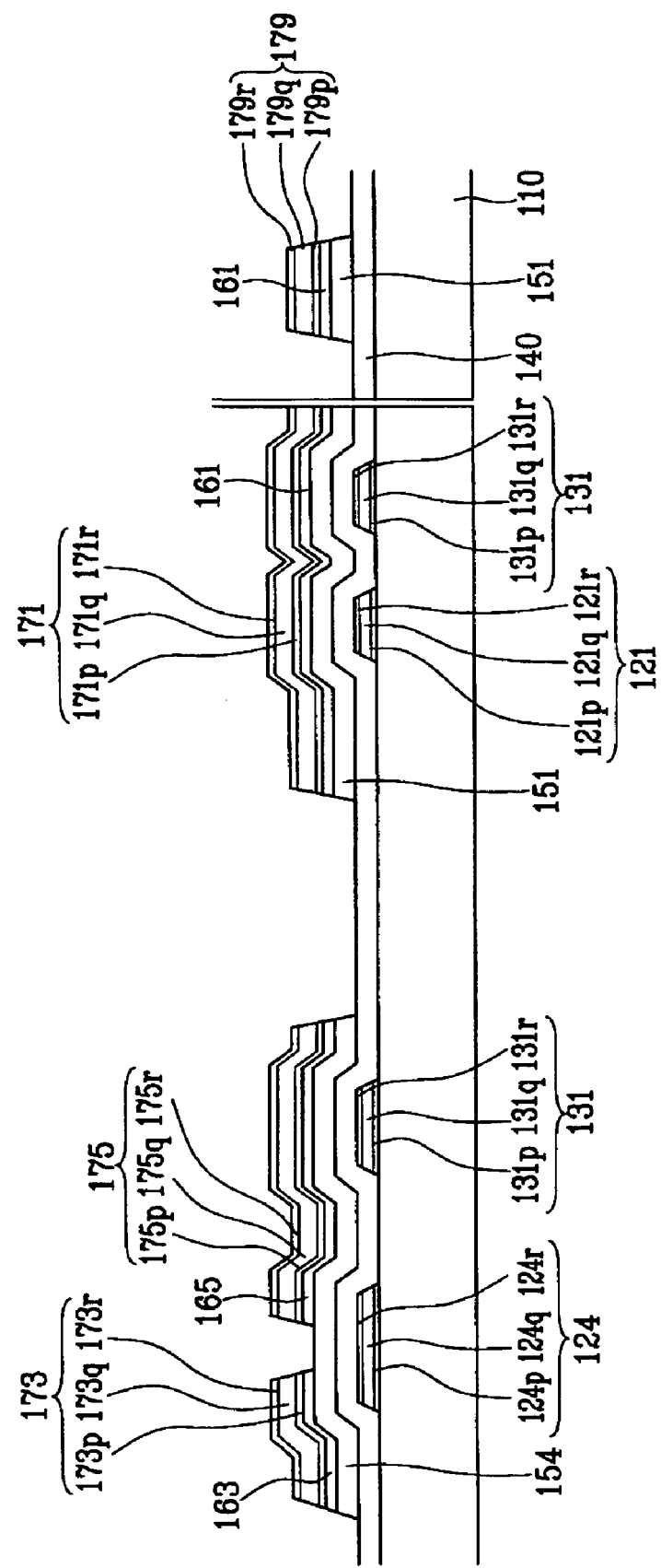

SIGNAL LINE FOR DISPLAY DEVICE AND THIN FILM TRANSISTOR ARRAY PANEL INCLUDING THE SIGNAL LINE

CROSS-REFERENCE TO RELATED APPLICATION

This patent application claims priority from Korean Patent Application No. 10-2004-0101916 filed on Dec. 6, 2004, the content of which is incorporated by reference herein in its entirety.

BACKGROUND OF THE INVENTION (a) Field of the Invention

The invention relates to a signal line and a thin film transistor (TFT) array panel for a display device that includes the signal line.

(b) Description of the Related Art

Liquid crystal displays (LCDs) are one of the most widely used types of flat panel displays. Typically, an LCD includes a liquid crystal (LC) layer interposed between two panels provided with field-generating electrodes. The LCD displays images by applying voltages to the field-generating electrodes to generate an electric field in the LC layer. The electric field determines the orientations of the LC molecules in the LC layer to vary light transmittance according to the polarization of incident light.

An LCD including two panels respectively provided with field-generating electrodes, wherein one panel has a plurality of pixel electrodes in a matrix and the other has a common electrode covering the entire surface of the panel, dominates the LCD market.

The LCD displays images by applying a different voltage to each pixel electrode. For this purpose, thin film transistors (TFTs) having three terminals to switch voltages applied to the pixel electrodes, are connected to the pixel electrodes. The TFTs are formed on a thin film transistor array panel. In addition, gate lines to transmit signals for controlling the thin film transistors and data lines to transmit voltages applied to the pixel electrodes are formed on a thin film transistor array panel.

A TFT is a switching element for transmitting the image signals from the data line to the pixel electrode in response to the scanning signals from the gate line.

The TFT is applied to an active matrix organic light emitting display as a switching element for controlling respective light emitting elements.

Currently, chromium (Cr) is conventionally the dominating material for the gate lines and the data lines of a TFT array panel. However, Cr is not an ideal material considering the increasing size trend of LCDs. Since the lengths of the gate and data lines increase along with the LCD size, a material that has a lower resistivity than Cr is desired. Due to its high resistivity, there are limitations to applying Cr to a large LCD.

Copper (Cu) is well known as a low-resistivity substitute for Cr. However, since Cu is sensitive to chemicals, when Cu is applied to signal lines, the signal lines may easily be oxidized and corroded. Furthermore, since organic material tend to condense on a Cu surface, signal lines made with Cu may be easily polluted with organic particles. The oxidation, corrosion, and the pollution may induce a rapid increase of the signal line resistance and degrade process reliability.

A low-resistivity material that can be used to build signal lines in a display device without suffering the above disadvantages of Cu is desired.

SUMMARY OF THE INVENTION

The invention solves the above mentioned problems and provides signal lines having low resistivity and good reliability. The invention also provides a thin film transistor array panel that has the signal lines and manufacturing method of the transistor array.

In one aspect, the invention provides a signal line including three conductive layers: a first conductive layer made of a molybdenum-containing conductor (Mo-containing conductor), a second conductive layer made of a Cu-containing conductor, and a third conductive layer made of a molybdenum nitride-containing conductor (MoN-containing conductor).

In another aspect, the invention provides a thin film transistor array panel that includes an insulating substrate, a gate line formed on the insulating substrate, a gate insulating layer formed on the gate line, and a drain electrode and a data line having a source electrode formed on the gate insulating layer, wherein the drain electrode and the source electrode are separated from each other. A pixel electrode is connected to the drain electrode. At least one of the gate line and the data line and drain electrode includes a first conductive layer made of a Mo-containing conductor, a second conductive layer made of a Cu-containing conductor, and a third conductive layer made of a MoN-containing conductor.

In yet another aspect, the invention provides a manufacturing method of a thin film transistor array panel. The method includes forming a gate line having a gate electrode on an insulating substrate, depositing a gate insulating layer and a semiconductor layer on the gate line in sequence, and forming a drain electrode and a data line having a source electrode on the gate insulating layer and the semiconductor layer, wherein the drain electrode is separated from the source electrode. A pixel electrode is connected to the drain electrode, and at least one step of the forming a gate line and the forming a data line and drain electrode entails depositing a first layer of Mo-containing conductor, a second layer of Cu-containing conductor, and a third layer of MoN and patterning the three conductive layers.

BRIEF DESCRIPTION OF THE DRAWINGS

FIG. 5B is a sectional view of the TFT array panel shown in FIG. 5A taken along the line Vb-Vb' in the step following the step shown in FIG. 4B;

FIG. 13B is a sectional view of the TFT array panel shown in FIG. 13A taken along the line XIIIb-XIIIb' in the step following the step shown in FIG. 12;

DETAILED DESCRIPTION OF THE EMBODIMENTS

Figure 1:
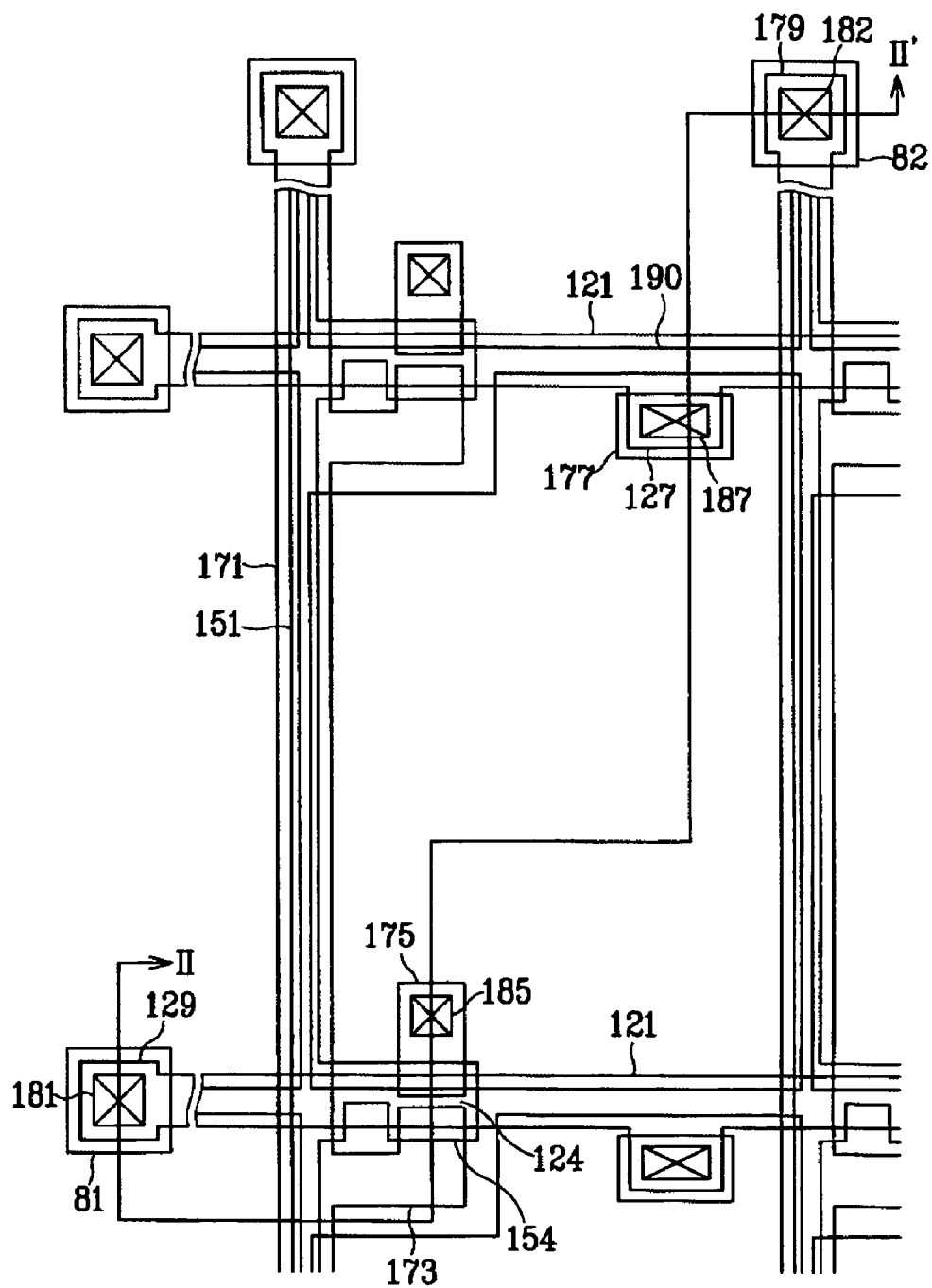
FIG. 1 is a layout view of a TFT array panel for an LCD according to an embodiment of the present invention.

Embodiments of the present invention will now be described more fully hereinafter with reference to the accompanying drawings, in which preferred embodiments of the invention are shown. The present invention may, however, be embodied in different forms and should not be construed as being limited to the embodiments set forth herein. Rather, these embodiments are provided so that this disclosure will be thorough and complete, and will fully convey the scope of the invention to those skilled in the art.

In the drawings, the thickness of layers, films, and regions are exaggerated for clarity. Like numerals refer to like elements throughout. It will be understood that when an element such as a layer, film, region, or substrate is referred to as being "on" another element, it can be directly on the other element or intervening elements may also be present.

TFT array panels and manufacturing methods thereof according to embodiments of this invention are described below in detail with reference to the accompanying drawings.

Embodiment 1

First, a TFT array panel for an LCD according to an embodiment of the present invention will be described in detail with reference to FIGS. 1 and 2.

Figure 2:
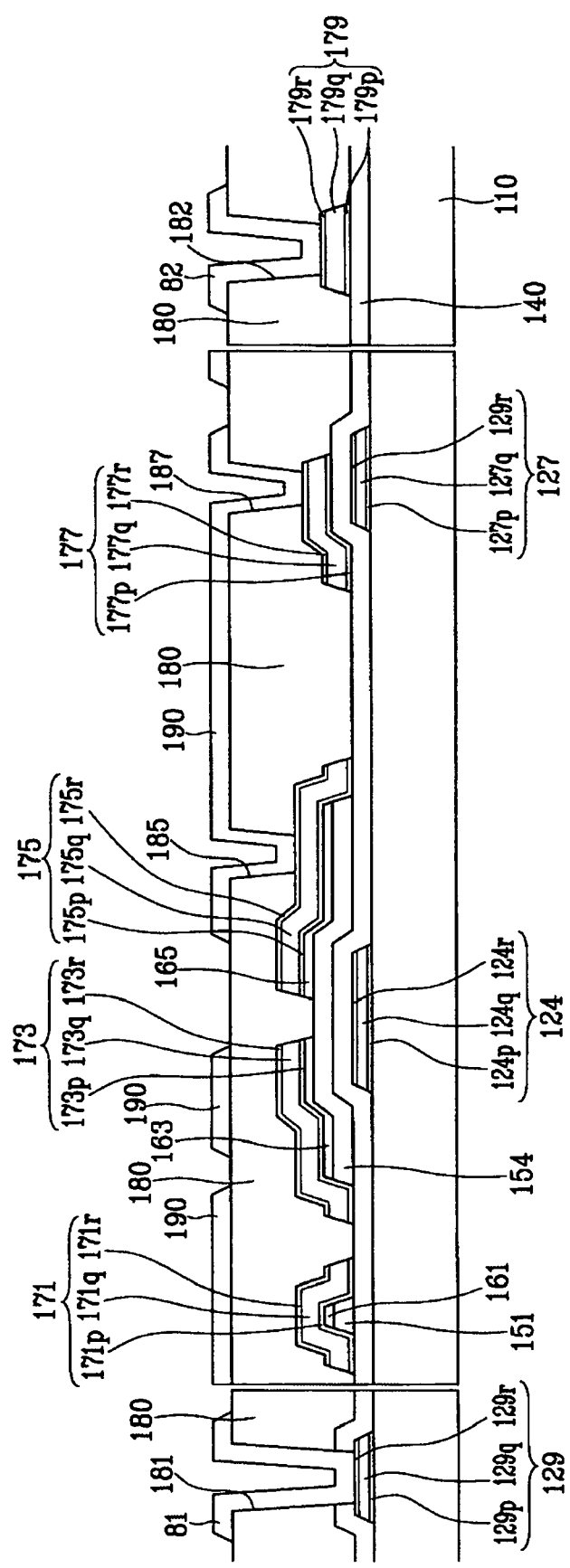
FIG. 2 is a sectional view of the TFT array panel shown in FIG. 1 taken along the line II-II.

FIG. 1 is a layout view of a TFT array panel for an LCD according to an embodiment of the present invention. FIG. 2 is a sectional view of the TFT array panel shown in FIG. 1 taken along the line II-II.

A plurality of gate lines 121 for transmitting gate signals are formed on an insulating substrate 110. The gate lines 121 mainly extend in the first direction (a horizontal direction with respect to FIG. 1) and partial portions thereof become a plurality of gate electrodes 124. Also, different partial portions thereof that extend in a lower direction become a plurality of expansions 127. An end portion 129 of the gate line 121 is made wider than the rest of the gate line 121 for connecting with an external device such as a driving circuit.

The gate line 121 has first layers 124$p$, 127$p$, and 129$p$, second layers 124$q$, 127$q$, and 129$q$, and third layers 124$r$, 127$r$, and 129$r$. The first layers 124$p$, 127$p$, and 129$p$ are made of a molybdenum-containing conductor such as Mo or Mo-alloy and are formed on the substrate 110. The second layers 124$q$, 127$q$, and 129$q$ are made of a copper-containing conductor such as Cu or Cu-alloy and are formed on the first layers 124$p$, 127$p$, and 129$p$. The third layers 124$r$, 127$r$, and 129$r$ are made of a molybdenum nitride-containing conductor and are formed on the second layers 124$q$, 127$q$, and 129$q$.

When a Mo layer is disposed between a Cu layer and a substrate, adhesiveness between the Cu layer and the substrate is enhanced to prevent the Cu layer from peeling and lifting. Accordingly, the first layers 124$p$, 127$p$, and 129$p$ enhance adhesiveness between the second layers 124$q$, 127$q$, and 129$q$ and the substrate 110.

Furthermore, the first layers 124$p$, 127$p$, and 129$p$ prevent Cu of the second layers 124$q$, 127$q$, and 129$q$ from diffusing into the substrate 110.

The third layers 124$r$, 127$r$, and 129$r$ of MoN are capping layers for protecting the second layers 124$q$, 127$q$, and 129$q$ of Cu which has a poor chemical resistance.

Generally, since Cu is sensitive to chemicals, when Cu is applied to signal lines, the signal lines may easily be oxidized and corroded. Furthermore, because organic material tend to condense on a Cu surface, signal lines may be easily polluted with organic particles. As mentioned above, the corrosion and the pollution induce a rapid increase in the signal line resistance.

Accordingly, in the present embodiment, the third layers 124$r$, 127$r$, and 129$r$ are disposed on the second layers 124$q$, 127$q$, and 129$q$ as capping layers to protect the second layers 124$q$, 127$q$, and 129$q$ from chemicals such as etchants. Accordingly, the third layers 124$r$, 127$r$, and 129$r$ prevent the second layers 124$q$, 127$q$, and 129$q$ from being corroded and oxidized.

Furthermore, a MoN layer blocks Cu diffusion. Accordingly, the third layers 124$r$, 127$r$, and 129$r$ prevent Cu in the second layers 124$q$, 127$q$, and 129$q$ from diffusing into other layers.

A Mo layer, a Cu layer, and a MoN layer can be simultaneously etched with the same etchant. Accordingly, the first layers 124$p$, 127$p$, and 129$p$, the second layers 124$q$, 127$q$, and 129$q$, and the third layers 124$r$, 127$r$, and 129$r$ can be etched with the etchant. For example, $H_2O_2$ may be used as the etchant.

The lateral sides of the third layers 124$r$, 127$r$, and 129$r$, the second layers 124$q$, 127$q$, and 129$q$, and the first layers 124$p$, 127$p$, and 129$p$ are inclined relative to a surface of the substrate 110 to form an inclination angle of about 30-80 degrees.

A gate insulating layer 140 preferably made of silicon nitride (SiNx) is formed on the gate lines 121.

A plurality of semiconductor stripes 151, preferably made of hydrogenated amorphous silicon (abbreviated to "a-Si"), are formed on the gate insulating layer 140. Each semiconductor stripe 151 extends substantially in the second direction and changes direction periodically. The second direction (which is the vertical direction with respect to FIG. 1) is substantially perpendicular to the first direction. Each semiconductor stripe 151 has a plurality of projections 154 branching out toward the gate electrodes 124. The width of each semiconductor stripe 151 increases near the gate lines 121 such that the semiconductor stripe 151 covers large areas of the gate lines 121.

A plurality of ohmic contact stripes 161 and islands 165, preferably made of silicide or n+ hydrogenated a-Si heavily doped with an n-type impurity, are formed on the semiconductor stripes 151. Each ohmic contact stripe 161 has a plurality of projections 163, and the projections 163 and the ohmic contact islands 165 are located in pairs on the projections 154 of the semiconductor stripes 151.

The edges of the semiconductor stripes 151 and the ohmic contacts 161 and 165 are tapered to form inclination angles of about 30-80 degrees with respect to the substrate 110.

A plurality of data lines 171, a plurality of drain electrodes 175, and a plurality of storage capacitor conductors 177 are formed on the ohmic contacts 161 and 165 and the gate insulating layer 140.

The data lines 171 for transmitting data voltages extend substantially in the second direction and intersect the gate lines 121 to define pixel areas arranged in a matrix. Each data line 171 has a plurality of branches which project toward the drain electrodes 175, form a plurality of source electrodes 173, and has an end portion 179 having an enlarged width compared to the rest of the data line 171. Each pair of the source electrodes 173 and the drain electrodes 175 are separated from each other and placed across the gate electrodes 124 from each other.

The data line 171, the drain electrode 175, and the storage capacitor conductor 177 have first layers 171p, 175p, and 177p, second layers 171q, 175q, and 177q, and third layers 171r, 175r, and 177r. The first layers 171p, 175p, and 177p and the third layers 171r, 175r, and 177r are respectively disposed at lower and upper sides of the second layers 171q, 175q, and 177q. The first layers 171p, 175p, and 177p are made of a Mo-containing conductor such as Mo or a Mo-alloy. The second layers 171q, 175q, and 177q are made of a Cu-containing conductor such as Cu itself or a Cu-alloy. The third layers 171r, 175r, and 177r are made of a MoN-containing conductor.

The first layers 171p, 175p, and 177p enhance the adhesiveness between the second layers 171q, 175q, and 177q and the gate insulating layer 140 to prevent the second layers 171q, 175q, and 177q of Cu from peeling and lifting.

Furthermore, the first layers 171p, 173p, 175p, and 177p prevent the Cu of the second layers 171q, 173q, 175q, and 177q from diffusing into the lower layers such as the ohmic contacts 161 and 165 and the semiconductor stripes 151 by oxidation.

The third layers 171r, 173r, 175r, and 177r of MoN prevent the second layers 171q, 173q, 175q, and 177q from being polluted, corroded, or oxidized.

The third layers 171r, 173r, 175r, and 177r prevent the Cu of the second layers 171q, 173q, 175q, and 177q from diffusing into other layers.

The data lines 171, the drain electrodes 175, and the storage capacitor conductor 177 have tapered edges, and the inclination angles of the edges relative to the substrate 110 are about 30-80 degrees.

A gate electrode 124, a source electrode 173, and a drain electrode 175, along with a projection 154 of a semiconductor stripe 151, forms a TFT having a channel formed in the projection 154 disposed between the source electrode 173 and the drain electrode 175. The storage capacitor conductor 177 overlaps with the expansion 127 of the gate line 121.

The ohmic contacts 161 and 165 are only interposed between the semiconductor stripe 151 and the data line 171 and between the drain electrode 175 and the projection 154 of the semiconductor stripe 151 in order to reduce the contact resistance therebetween.

The semiconductor stripe 151 is partially exposed at the place between the source electrode 173 and the drain electrode 175 and at the other places not covered with the data line 171 and the drain electrode 175. Most of the semiconductor stripe 151 is narrower than the data line 171 but the width of the semiconductor stripe 151 broadens near a place where the semiconductor stripe 151 and the gate line 121 meet each other in order to prevent disconnection of the data line 171.

On the data line 171, the drain electrode 175, the storage capacitor conductor 177, and the exposed region of the semiconductor stripe 151, a passivation layer 180 is provided, which is made of an organic material having substantial planarization properties and photosensitivity or an insulating material with a low dielectric constant, such as a-Si:C:O, a-Si:O:F, etc. This passivation layer 180 is formed by plasma enhanced chemical vapor deposition (PECVD). To prevent the organic material of the passivation layer 180 from contacting the projection 154 of the semiconductor strips 151 exposed between the data line 171 and the drain electrode 175, the passivation layer 180 can be structured in a way that an insulating layer made of SiNx or $SiO_2$ is additionally formed under the organic material layer.

In the passivation layer 180, a plurality of contact holes 181, 185, 187, and 182 are formed to expose an end portion 129 of the gate line 121, the drain electrode 175, the storage capacitor conductor 177, and an end portion 179 of the data line 171, respectively.

A plurality of pixel electrodes 190 and a plurality of contact assistants 81 and 82, which are made of indium zinc oxide (IZO) or indium tin oxide (ITO), are formed on the passivation layer 180.

Since the pixel electrode 190 is physically and electrically connected with the drain electrode 175 and the storage capacitor conductor 177 through the contact holes 185 and 187, respectively, the pixel electrode 190 receives the data voltage from the drain electrodes 175 and transmits it to the storage capacitor conductor 177.

The pixel electrode 190 to which the data voltage is applied generates an electric field with a common electrode (not illustrated) of the opposite panel (not illustrated) to which a common voltage is applied, so that the liquid crystal molecules in the liquid crystal layer are rearranged.

Also, as mentioned in the above, the pixel electrode 190 and the common electrode form a capacitor to store and preserve the received voltage after the TFT is turned off. This capacitor will be referred to as a "liquid crystal capacitor." To enhance the voltage storage ability, another capacitor is provided, which is connected with the liquid crystal capacitor in parallel and will be referred to as a "storage capacitor." The storage capacitor is formed at where the pixel electrode 190 and the adjacent gate line 121 overlap. This adjacent gate line 121 will be referred to as "previous gate line." The expansion 127 of the gate line 121 is provided to ensure the largest possible overlap dimension and thus to increase the storage capacity of the storage capacitor. The storage capacitor conductor 177 is connected to the pixel electrode 190 and overlaps the expansion 127, and is provided at the bottom of the passivation layer 180 so that the pixel electrode 190 becomes close to the previous gate line 121.

The contact assistants 81 and 82 are respectively connected to the end portions 129 and 179 of the gate line 121 and the data line 171. The contact assistants 81 and 82 respectively supplement the adhesion between the end portion 129 of the gate line 121 and the exterior devices, such as the driving integrated circuit, and between the end portion 179 of the data line 171 and the exterior devices. In addition, the contact assistants 81 and 82 provide protection. Applying the contact assistants 81 and 82 is optional.

A method of manufacturing a TFT array panel will be now described in detail with reference to FIGS. 3A to 6B as well as FIGS. 1 and 2.

Figure 3A:
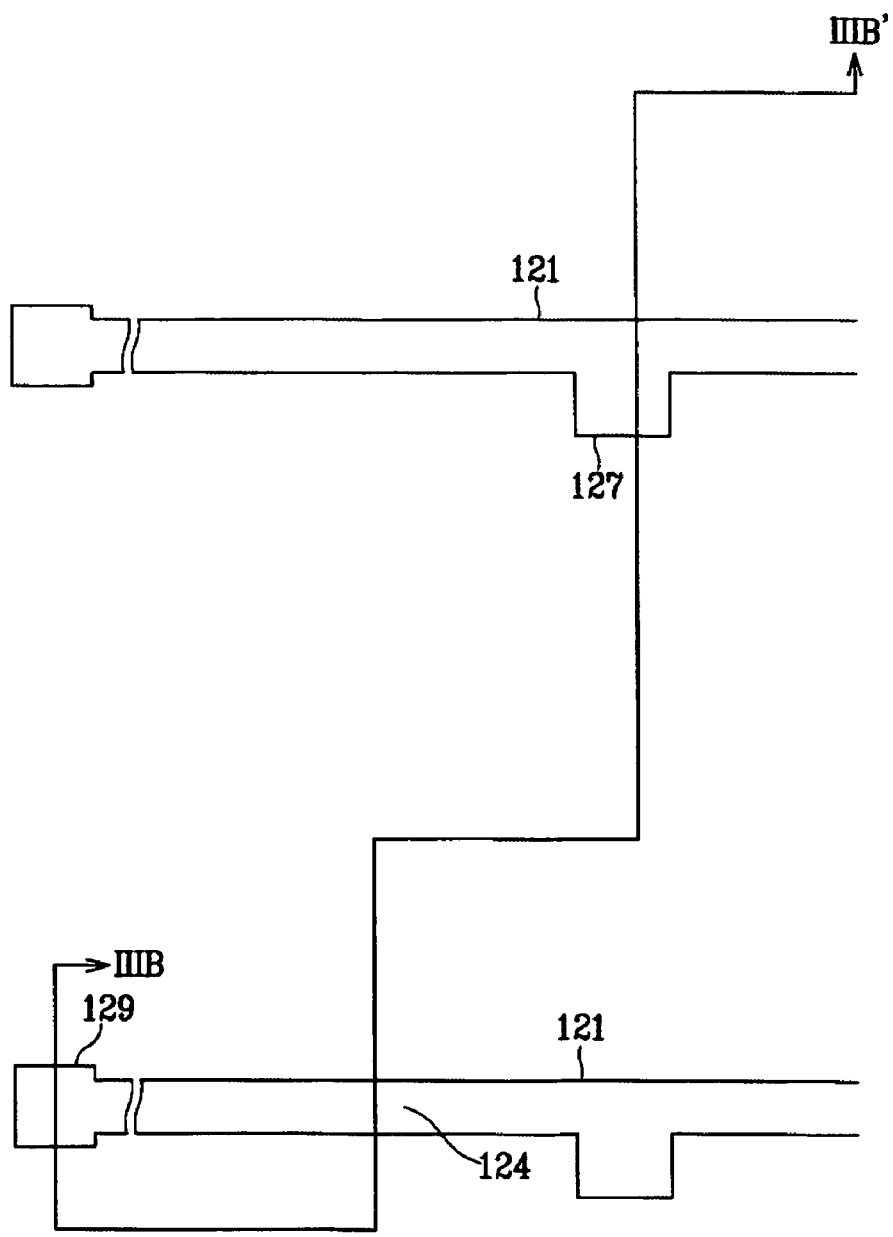
FIGS. 3A, 4A, 5A, and 6A are layout views sequentially illustrating the intermediate steps of a method of manufacturing a TFT array panel for an LCD according to the embodiment of FIGS. 1 and 2.
Figure 3B:
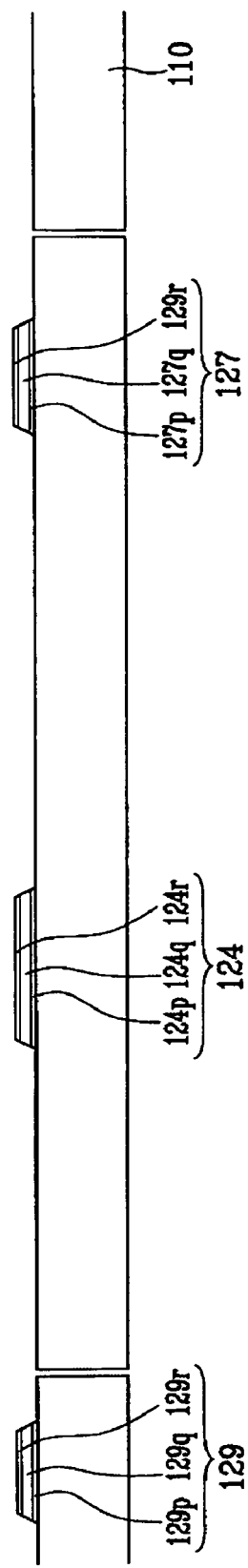
FIG. 3B is a sectional view of the TFT array panel shown in FIG. 3A taken along the line IIIb-IIIb'.

At first, as shown in FIGS. 3A and 3B, a first layer of Mo-containing conductor, a second layer of a Cu-containing conductor and a third layer of a MoN-containing conductor are deposited on an insulating substrate 110.

The first to third layers are deposited by co-sputtering. Two targets are positioned in the same sputtering chamber for the co-sputtering. One target is made of a Mo-containing conductor such as Mo or Mo-alloy. The other target is made of a Cu-containing conductor such as Cu or Cu-alloy.

The co-sputtering is performed as follows.

At first, power is applied to the Mo target while no power is applied to the Cu target, so that a Mo layer can be deposited. The Mo layer has a thickness of about 50 to about 500 Å, preferably about 100 to about 300 Å.

When the Mo layer is thinner than 50 Å, the Cu layer may directly contact the substrate 110 to degrade the adhesiveness between the substrate 110 and the Cu layer. When the Mo layer is thicker than 500 Å, it may induce an increase in resistance.

Next, power is switched to be applied to the Cu target and not to the Mo target, so that a Cu layer can be deposited. The Cu layer has a thickness of about 1,000 to about 3,000 Å, preferably about 1,500 to about 2,500 Å.

Next, power is switched again to be applied to the Mo target and not to the Cu target, so that a MoN layer can be deposited. The sputtering is performed while applying nitrogen gas ($N_2$), nitrous oxide ($N_2O$), or ammonia ($NH_3$). The MoN layer has a thickness of about 50 to about 2000 Å, preferably about 100 to about 500 Å.

When the MoN layer is thinner than 50 Å, the role of the MoN layer as a capping layer may not be served as well. When the MoN layer is thicker than 2,000 Å, it may induce an increase in contact resistance.

The Mo layer is disposed between a Cu layer and a substrate to enhance the adhesiveness between the Cu layer and the substrate, thus preventing the Cu layer from peeling and lifting.

The MoN layer is disposed on the Cu layer as a capping layer to protect the Cu layer from chemicals such as etchants. Accordingly, the MoN layer prevents the Cu layer from being oxidized or polluted by organic particles.

Furthermore, the MoN layer blocks Cu diffusion to upper layers such as a gate insulating layer 140.

The MoN layer prevents oxidation of the Cu layer at the interface between the MoN layer and the Cu layer due to the effect of nitrogen.

Then, photoresist is coated on the MoN layer and is illuminated through a photo-mask. Next, the illuminated photoresist is developed.

The MoN layer, the Cu layer, and the Mo layer are simultaneously etched to form a plurality of gate lines 121. The etchant is preferably a weak acid such as hydrogen peroxide ($H_2O_2$) since Cu is rapidly etched with an acid.

Generally, since Cu adheres poorly to a substrate or other layer, a Cu layer is easily lifted or peeled. Since Cu has a poor chemical resistance, a Cu layer may easily get damaged by etchants or by a photoresist stripper. Accordingly, a single Cu layer cannot be a signal line.

In the present invention, to solve the above mentioned problems, additional layers of one or more other conductors are applied on and/or under the Cu layer. However, when additional layers are applied, an additional etching process may be required due to a differential in the etching speeds of the Cu layer and the additional layers. To avoid the need for an additional etching step, it is preferable that the additional layer contain a material that can be etched along with the Cu layer using the same etchant while being capable of efficiently preventing oxidation of the Cu layer.

In the present invention, to comply with the mentioned condition, a Mo layer and a MoN layer are respectively applied on and under the Cu layer.

Figure 15A:
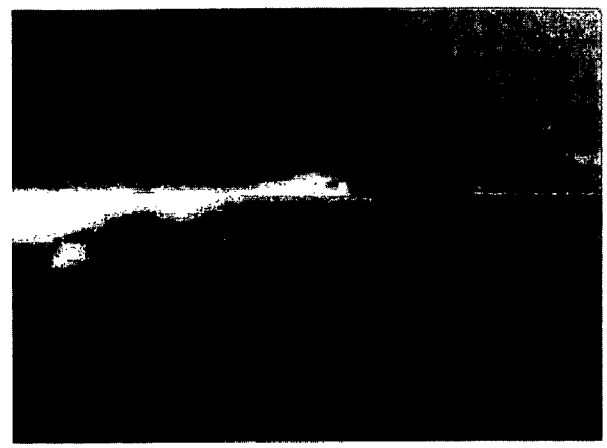
FIG. 15A is a picture illustrating the profile of a triple-layered structure including a Mo layer, a Cu layer, and a Mo layer.
Figure 15B:
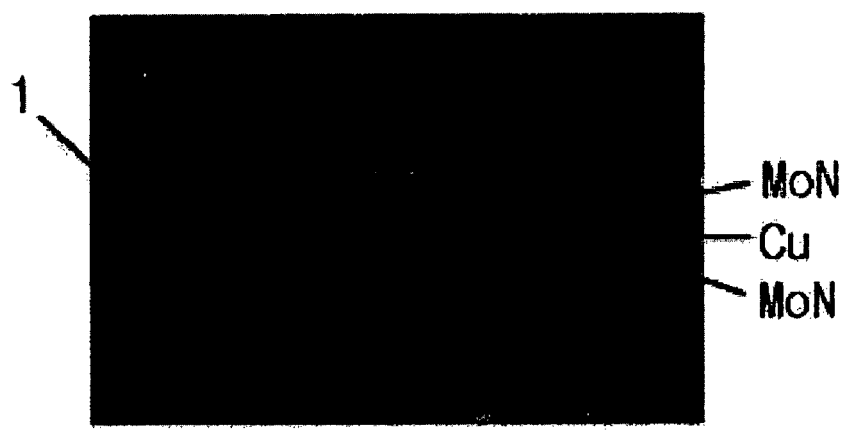
FIG. 15B is a picture illustrating the profile of a triple-layered structure including a MoN layer, a Cu layer, and a MoN layer.
Figure 15C:
FIG. 15C is a picture illustrating the profile of a triple-layered structure including a Mo layer, a Cu layer, and a MoN layer.

FIG. 15A is a picture illustrating the profile of a triple-layered structure including a Mo layer, a Cu layer, and a Mo layer. FIG. 15B is a picture illustrating the profile of a triple-layered structure including a MoN layer, a Cu layer, and a MoN layer. FIG. 15C. is a picture illustrating the profile of a triple-layered structure including a Mo layer, a Cu layer, and a MoN layer.

FIG. 15A demonstrates that patterning of the triple layers of Mo, Cu, and Mo resulted in a bad profile. Due to the bad profile, it is difficult to even distinguish the pattern. Accordingly, measurements of the inclination angle and the critical dimension (CD) of the pattern are not available.

FIG. 15B demonstrates that when the triple layers of MoN, Cu, and MoN are patterned, a MoN tail 1 of the lower MoN layer is formed due to discrepancies in the etching speeds of the different layers. Accordingly, the measurements for the inclination angle and the critical dimension (CD) of the pattern are not available.

FIG. 15C demonstrates that the triple layers of Mo, Cu, and MoN are patterned to form a good profile. The inclination angle is about 35 to 45 degrees and has a CD skew of 1.5 to 2.0 µm.

As described, a Mo layer and a MoN layer respectively disposed under and on a Cu layer form signal lines having a good profile when etched simultaneously.

Through the above-described processes, as shown in FIGS. 3A and 3B, a plurality of gate lines 121 having a plurality of gate electrodes 124, expansions 127, and end portions 129 are formed.

Figure 4A:
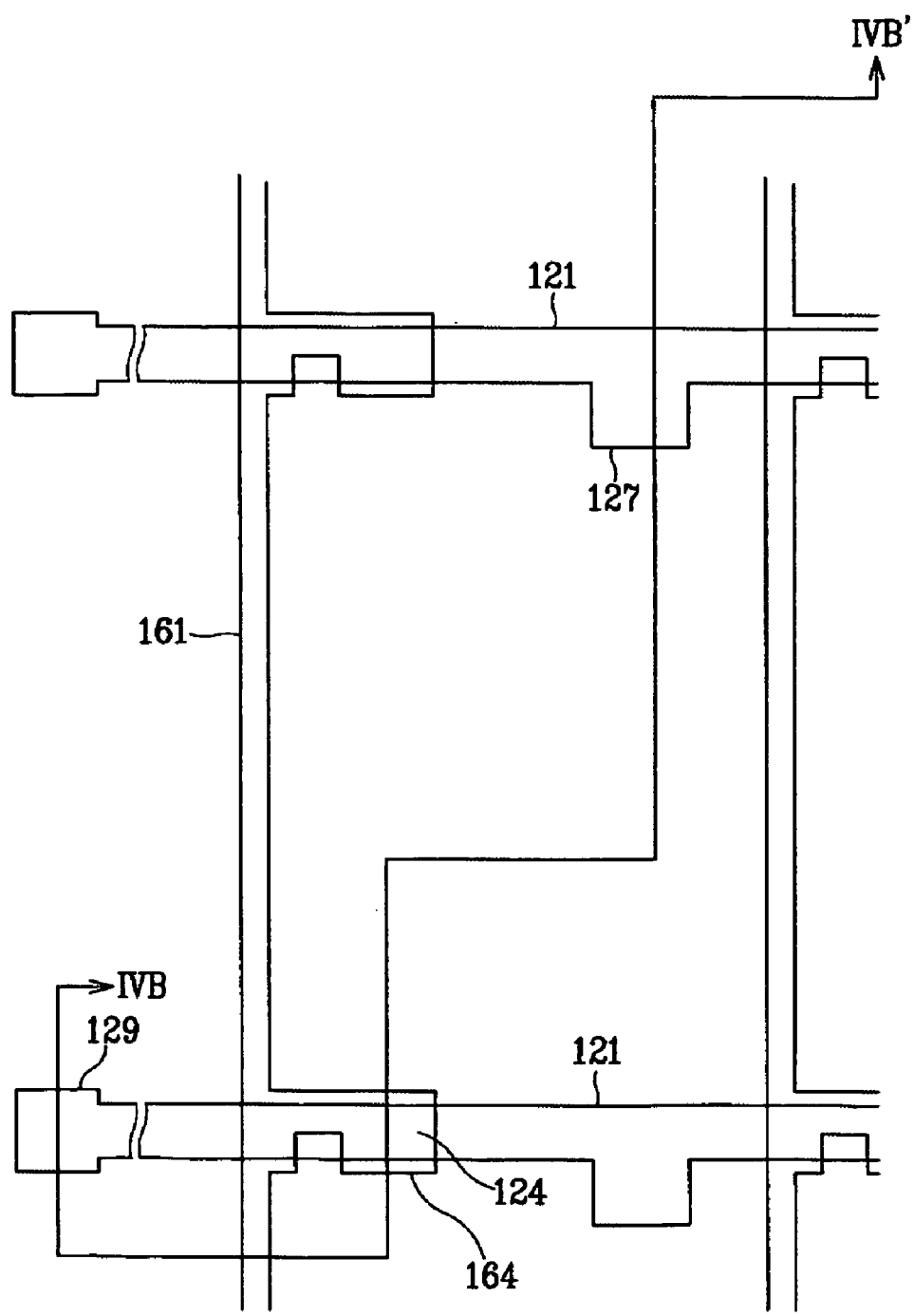
Figure 4B:
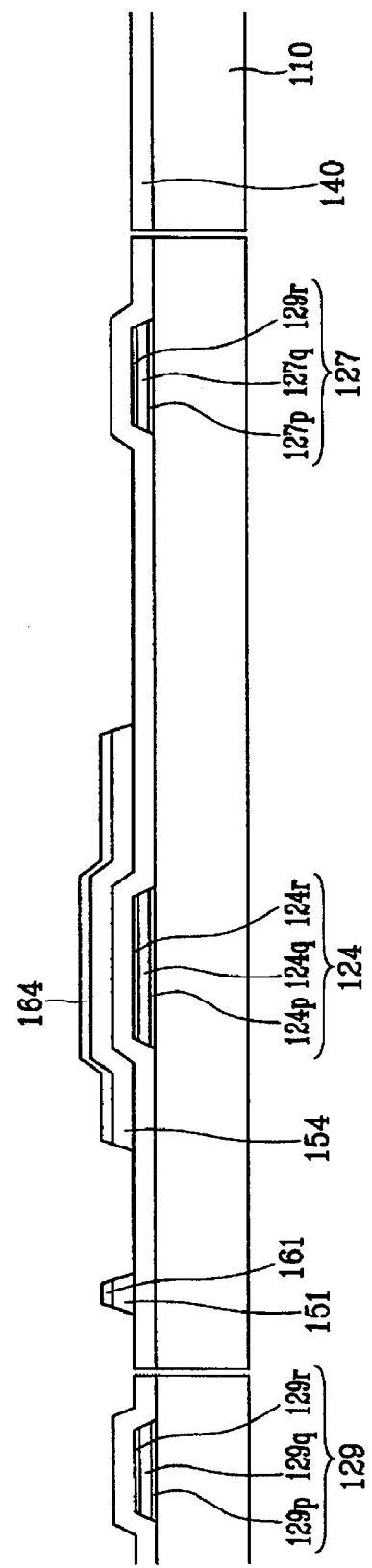
FIG. 4B is a sectional view of the TFT array panel shown in FIG. 4A taken along the line IVb-IVb' in the step following the step shown in FIG. 3B.

Referring to FIGS. 4A and 4B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 161 and a plurality of intrinsic semiconductor stripes 151 respectively having projections 164 and 154. The gate insulating layer 140 is preferably made of silicon nitride with a thickness of about 2,000 Å to about 5,000 Å, and the deposition temperature is preferably between about 250° C. and about 500° C.

Next, a first layer of Mo, a second layer of Cu, and a third layer of MoN are sequentially deposited on the extrinsic semiconductor stripes 161.

The first to third layers are deposited by co-sputtering. Two targets are positioned in the same sputtering chamber for the co-sputtering. One target is made of a Mo-containing conductor such as Mo or a Mo-alloy. The other target is made of a Cu-containing conductor such as Cu or a Cu-alloy.

The co-sputtering is performed as follows.

At first, power is applied to the Mo target while no power is applied to the Cu target to deposit a Mo layer. The Mo layer has a thickness of about 50 to about 500 Å, preferably about 100 to about 300 Å.

When the Mo layer is thinner than 50 Å, the Cu layer may directly contact the underlying layers to degrade the adhesiveness. When the Mo layer has a thickness greater than 500 Å, it may increase the resistance.

Next, power is switched to be applied to the Cu target and not to the Mo target, so that a Cu layer can be deposited. The Cu layer has a thickness of about 1,000 to about 3,000 Å, preferably about 1,500 to about 2,500 Å.

Next, power is switched again to be applied to the Mo target and not to the Cu target to deposit a MoN layer. The sputtering is performed while applying nitrogen gas ($N_2$), nitrous oxide ($N_2O$), or ammonia ($NH_3$). The MoN layer has a thickness of about 50 to about 2000 Å, preferably about 100 to about 500 Å.

When the MoN layer is thinner than 50 Å, the role of MoN layer as a capping layer may not be well-served. On the other hand, when the MoN layer his thicker than 2,000 Å, it may induce an increase in contact resistance.

The Mo layer enhances the adhesiveness between the Cu layer and the lower layers such as the ohmic contacts 161, 163, and 165 to prevent the Cu layer from peeling and lifting.

The MoN layer is disposed on the Cu layer as a capping layer to protect the Cu layer from chemicals such as etchants. Accordingly, the MoN layer prevents the Cu layer from being oxidized or polluted by organic particles.

Furthermore, the MoN layer blocks Cu diffusion to upper layers.

Then, the photoresist is coated on the MoN layer and is illuminated through a photo-mask. Next, the illuminated photoresist is developed.

The MoN layer, the Cu layer, and the Mo layer are simultaneously etched to form a plurality of data lines 171 with an etchant. The etchant is preferably a weak acid such as hydrogen peroxide ($H_2O_2$) since Cu is rapidly etched with an acid.

Figure 5A:
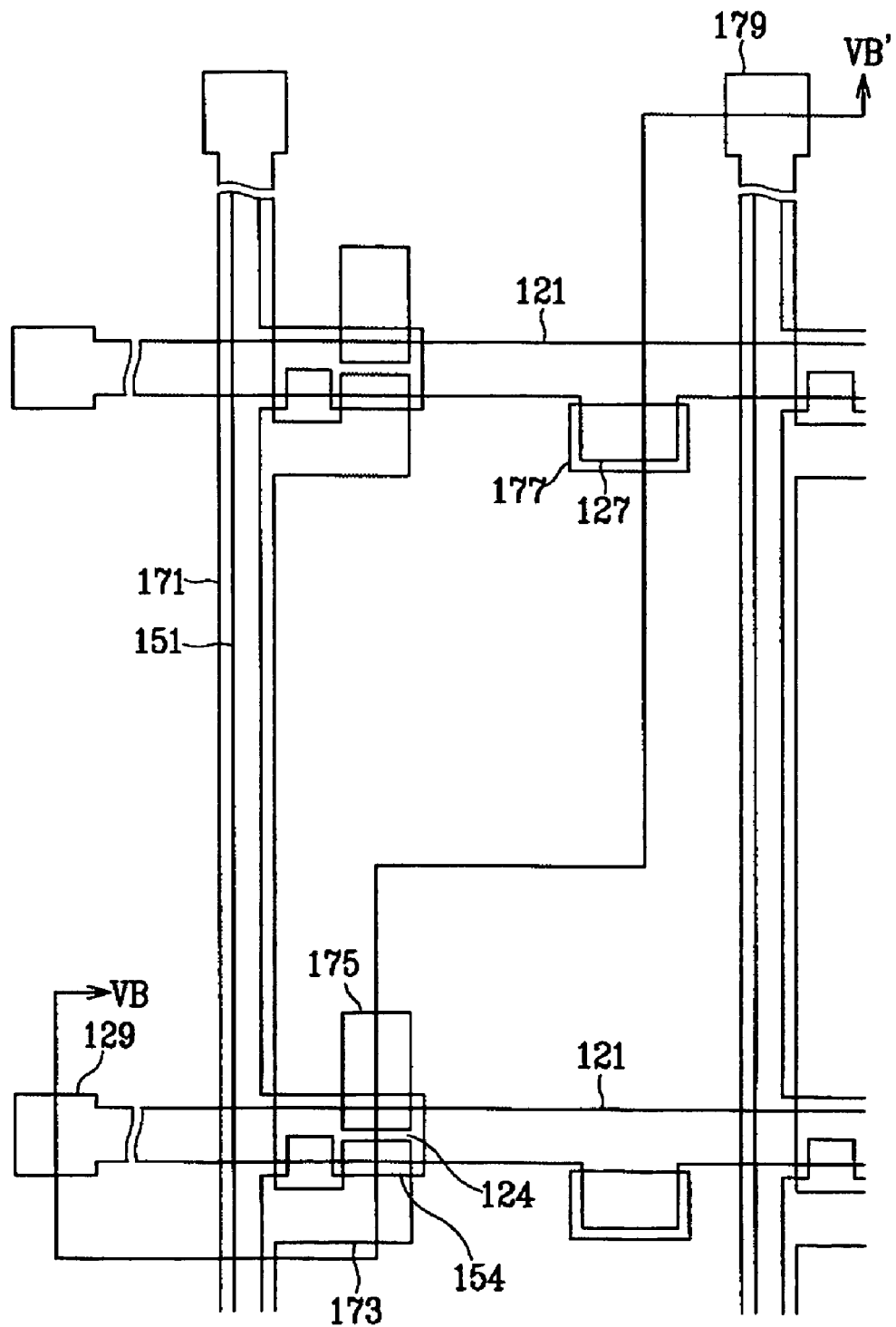

Through the above-described processes, as shown in FIGS. 5A and 5B, a plurality of data lines 171 having a plurality of source electrodes 173, a plurality of drain electrodes 175, an end portion 179, and storage capacitor conductors 177 are formed.

Next, portions of the extrinsic semiconductor stripes 161, which are not covered with the data lines 171 and the drain electrodes 175, are removed by etching to complete a plurality of ohmic contacts 163 and 165 and to expose portions of the intrinsic semiconductor stripes 151. Oxygen plasma treatment may follow thereafter in order to stabilize the exposed surfaces of the semiconductor stripes 151.

Figure 6A:
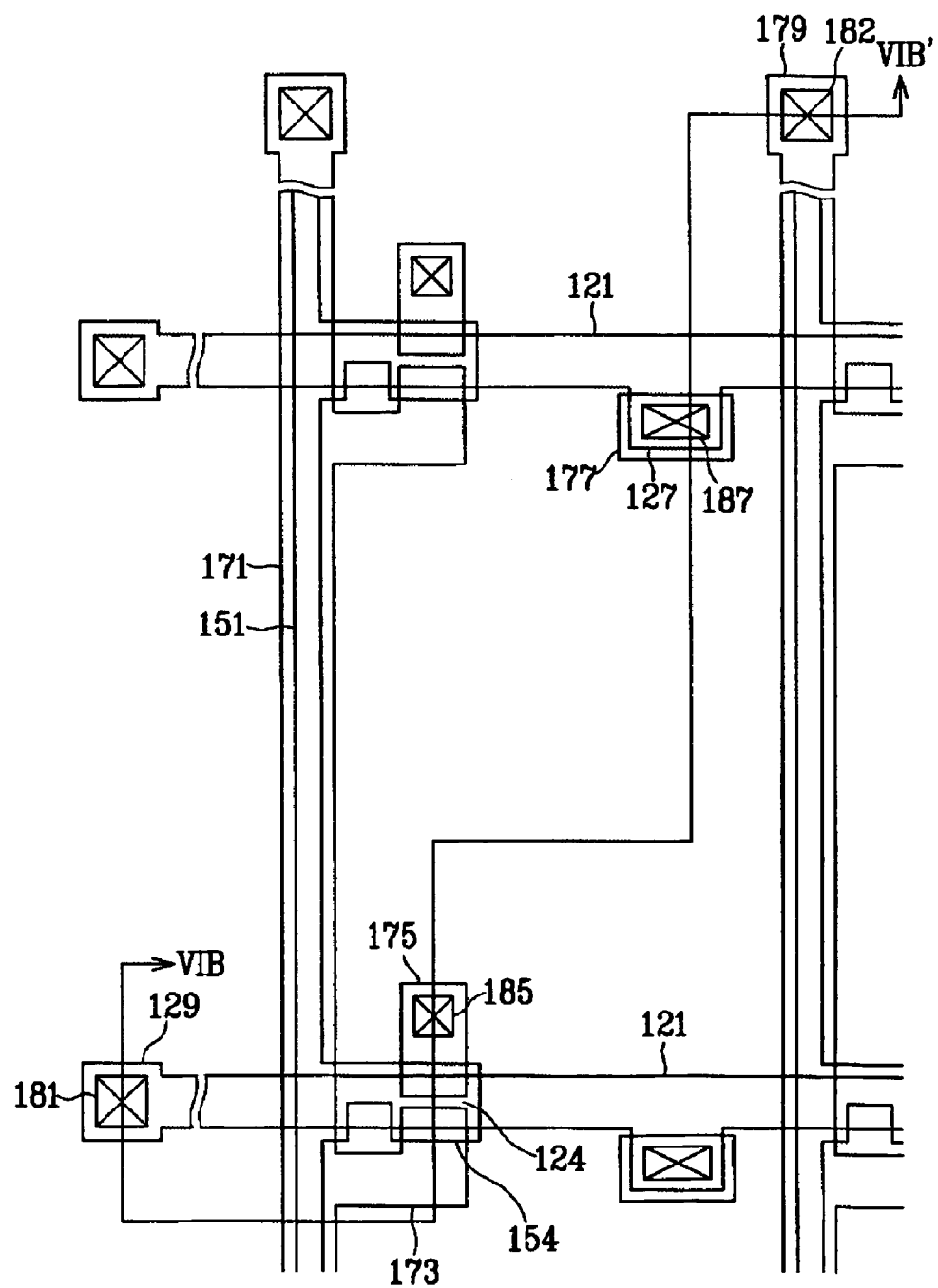
Figure 6B:
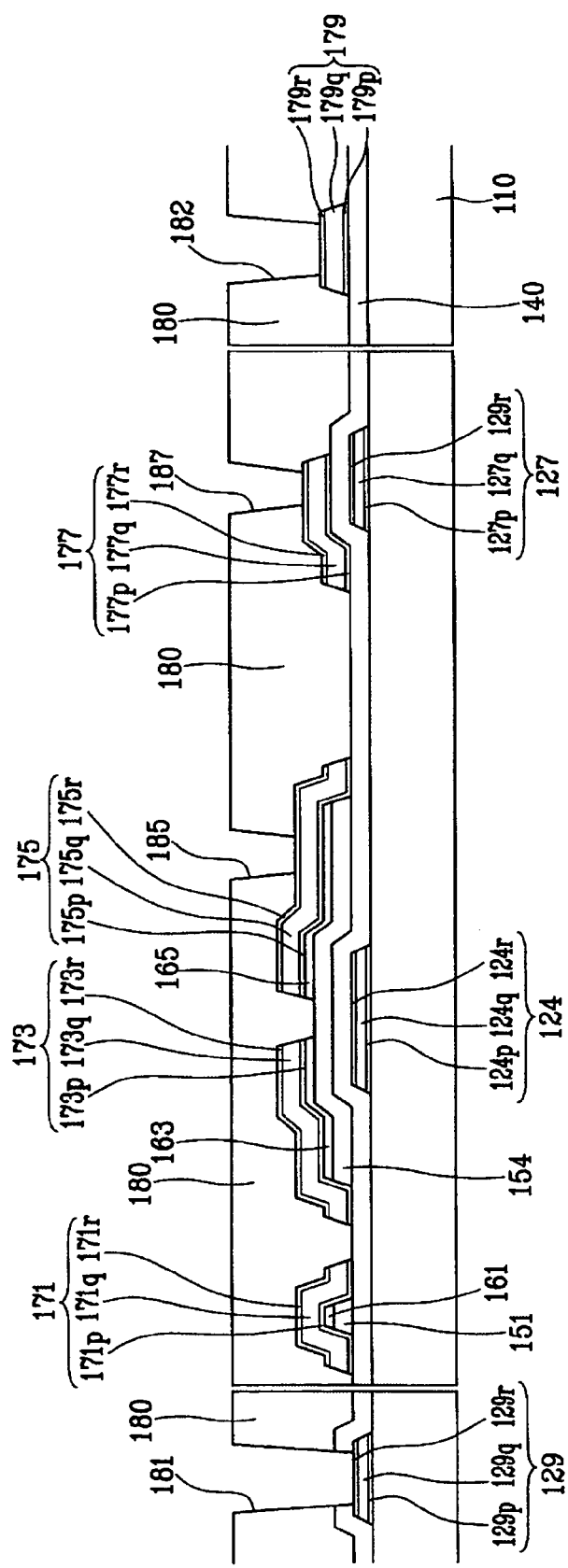
FIG. 6B is a sectional view of the TFT array panel shown in FIG. 6A taken along the line VIb-VIb' in the step following the step shown in FIG. 5B.

Referring to FIGS. 6A and 6B, a passivation layer 180 is deposited and dry etched along with the gate insulating layer 140 to form a plurality of contact holes 181, 185, 187, and 182. The gate insulating layer 140 and the passivation layer 180 are preferably etched under etching conditions that result in substantially the same etch ratio for both the gate insulating layer 140 and the passivation layer 180.

When the passivation layer is made of a photosensitive material, the contact holes can be formed only by photolithography.

Next, an ITO layer is deposited on the passivation layer 180 to have a thickness of about 400 to about 1500 Å and is patterned to form a plurality of pixel electrodes 190 and contact assistants 81 and 82.

In the present embodiment, both of gate lines and data lines have a triple-layered structure including a Mo layer, a Cu layer, and a MoN layer. However, this is not a limitation of the invention and in other embodiments, only one of the gate lines and the data lines may have the triple layered structure.

Embodiment 2

In Embodiment 1, the data lines and the semiconductors are formed by different photo etching processes using different photo masks. However, the data lines and the semiconductors may be simultaneously formed by a photo etching process using the same photo mask to reduce production costs. Such an embodiment will now be described in detail with reference to the drawings.

Figure 7:
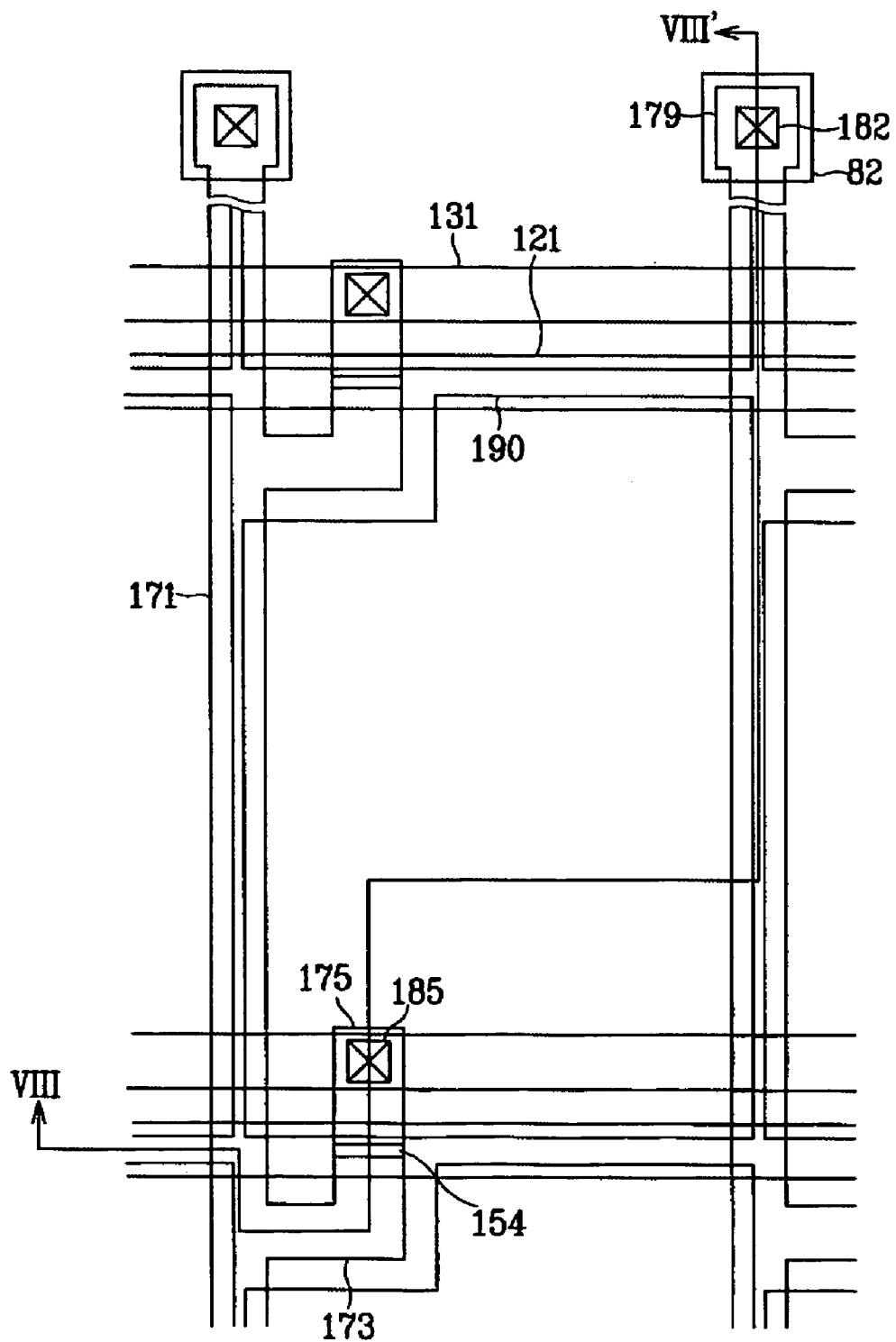
FIG. 7 is a layout view of a TFT array panel according to another embodiment of the present invention.
Figure 8:
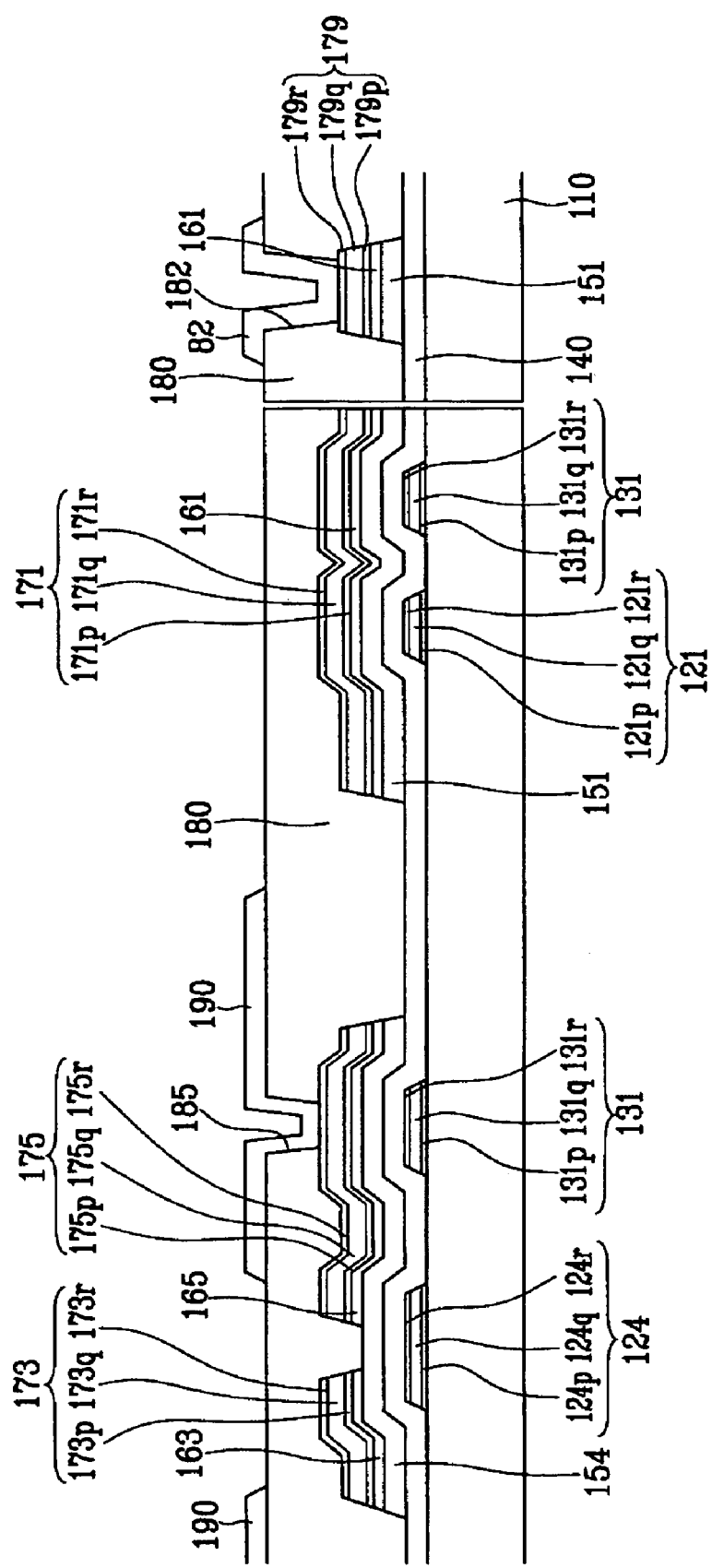
FIG. 8 is a sectional view of the TFT array panel shown in FIG. 7 taken along the line VIII-VIII.

FIG. 7 is a layout view of a TFT array panel for an LCD according to another embodiment of the present invention. FIG. 8 is a sectional view of the TFT array panel shown in FIG. 7 taken along the line VIII-VIII'.

Referring to FIGS. 7 and 8, a plurality of gate lines 121, including a plurality of gate electrodes 124 and a plurality of storage electrode lines 131, which are electrically separated from the gate lines 121, are formed on a substrate 110.

The gate lines 121 and the storage electrode lines 131 have first layers 121p, 124p, and 131p, second layers 121q, 124q, and 131q, and third layers 121r, 124r, and 131r. The first layers 121p, 124p, and 131p are made of a molybdenum-containing conductor such as Mo or Mo-alloy and are formed on the substrate 110. The second layers 121q, 124q, and 131q are made of a copper-containing conductor such as Cu or a Cu-alloy and are formed on the first layers 121p, 124p, and 131p. The third layers 121r, 124r, and 131r are made of a molybdenum nitride-containing conductor and are formed on the second layers 121q, 124q, and 131q.

When a Mo layer is disposed between a Cu layer and a substrate, the adhesiveness between the Cu layer and the substrate is enhanced to prevent the Cu layer from peeling and lifting. Accordingly, the first layers 121p, 124p, and 131p enhance the adhesiveness between the second layers 121q, 124q, and 131q and the substrate 110.

Furthermore, the first layers 121p, 124p, and 131p prevent Cu of the second layers 121q, 124q, and 131q from diffusing into the substrate 110.

The third layers 121r, 124r, and 131r of MoN are capping layers for protecting the second layers 121q, 124q, and 131q of Cu, which has poor chemical resistance.

Generally, since Cu is susceptible to chemicals, when Cu is applied to signal lines, the signal lines may easily be oxidized and corroded. Furthermore, as mentioned above, organic material tends to condense on a Cu surface. Thus, signal lines may be easily polluted with organic particles. This may induce a rapid increase of the signal line resistance.

Accordingly, in the present embodiment, the third layers 124r, 127r, and 129r are disposed on the second layers 121q, 124q, and 131q as capping layers to protect the second layers 121q, 124q, and 131q from chemicals such as etchants. Accordingly, the third layers 124r, 127r, and 129r prevent the second layers 121q, 124q, and 131q from corroding and oxidizing.

Furthermore, a MoN layer blocks Cu diffusion. Accordingly, the third layers 124r, 127r, and 129r prevent Cu of the second layers 121q, 124q, and 131q from diffusing into other layers.

A Mo layer, a Cu layer, and a MoN layer can be simultaneously etched with the same etchant. Accordingly, the first layers 121p, 124p, and 131p, the second layers 121q, 124q, and 131q, and the third layers 124r, 127r, and 129r can be etched with the same etchant. For example, H2O2 may be used as the etchant.

The lateral sides of the third layers 121r, 124r, and 131r, the second layers 121q, 124q, and 131q, and the first layers 121p, 124p, and 131p are inclined relative to a surface of the substrate 110 to form inclination angles of about 30-80 degrees.

A gate insulating layer 140 preferably made of silicon nitride (SiNx) is formed on the gate lines 121.

A plurality of semiconductor stripes 151 preferably made of hydrogenated amorphous silicon (herein referred to as "a-Si") are formed on the gate insulating layer 140. Each semiconductor stripe 151 extends substantially in the second direction and has a plurality of projections 154 branching out toward the gate electrodes 124. The projections 154 have portions overlapping the storage electrode line 131.

A plurality of ohmic contact stripes 161 and islands 165 preferably made of silicide or n+ hydrogenated a-Si heavily doped with n-type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductors 151 and the ohmic contacts 161 and 165 are inclined relative to a surface of the substrate 110 to form inclination angles of about 30-80 degrees.

A plurality of data lines 171 and a plurality of drain electrodes 175 are formed on the ohmic contacts 161 and 165 and the gate insulating layer 140.

The data lines 171 for transmitting data voltages extend substantially in the second direction and intersect the gate lines 121 to define pixel areas arranged in a matrix. A plurality of branches from each data line 171 that project toward the drain electrodes 175 form a plurality of source electrodes 173. Each pair of the source electrodes 173 and the drain electrodes 175 are separated from each other and positioned across a gate electrode 124 from each other.

The data line 171 and the drain electrode 175 have first layers 171$p$ and 175$p$, second layers 171$q$ and 175$q$, and third layers 171$r$ and 175$r$. The first layers 171$p$ and 175$p$ and the third layers 171$r$ and 175$r$ are respectively disposed at lower and upper sides of the second layers 171$q$ and 175$q$. The first layers 171$p$ and 175$p$ are made of a Mo-containing conductor such as Mo or a Mo-alloy. The second layers 171$q$ and 175$q$ are made of a Cu-containing conductor such as Cu itself or a Cu-alloy. The third layers 171$r$ and 175$r$ are made of a MoN-containing conductor.

The first layers 171$p$, 173$p$, and 175$p$ enhance the adhesiveness between the second layers 171$q$, 173$q$, and 175$q$ and the gate insulating layer 140 to prevent the second layers 171$q$, 173$q$, and 175$q$ of Cu from peeling and lifting.

Furthermore, the first layers 171$p$, 173$p$, and 175$p$ prevent the Cu of the second layers 171$q$, 173$q$, and 175$q$ from diffusing into the lower layers, such as the ohmic contacts 161 and 165 and the semiconductor stripes 151. In addition, the first layers 171$p$, 173$p$, and 175$p$ protect the Cu of the second layers 171$q$, 173$q$, and 175$q$ from oxidation.

The third layers 171$r$, 173$r$, and 175$r$ of MoN prevent the second layers 171$q$, 173$q$, and 175$q$ from being polluted, corroded, or oxidized.

The third layers 171$r$, 173$r$, and 175$r$ prevent the Cu of the second layers 171$q$, 173$q$, and 175$q$ from diffusing into other layers.

The ohmic contacts 161 and 165 are interposed only between the underlying semiconductors 151 and the overlying data lines 171 and drain electrodes 175, and reduce the contact resistance therebetween. The semiconductor stripes 151 include a plurality of exposed portions that are not covered with the data lines 171 and the drain electrodes 175, such as portions located between the source electrodes 173 and the drain electrodes 175.

A gate electrode 124, a source electrode 173, and a drain electrode 175, along with a projection 154 of a semiconductor stripe 151, form a TFT having a channel formed in the projection 154 disposed between the source electrode 173 and the drain electrode 175.

The data lines 171 and the drain electrodes 175 have tapered edges, and the inclination angles of the edges are about 30-80 degrees.

On the data line 171, the drain electrode 175, and the exposed region of the semiconductor stripe 151, a passivation layer 180 is provided, which is made of an organic material having substantial planarization properties and photosensitivity or an insulating material with a low dielectric constant, such as a-Si:C:O, a-Si:O:F, etc. This passivation layer 180 is formed by plasma enhanced chemical vapor deposition (PECVD). To prevent the organic material of the passivation layer 180 from contacting the semiconductor strips 151 exposed between the data line 171 and the drain electrode 175, the passivation layer 180 can be structured in a way that an insulating layer made of SiNx or SiO2 is additionally formed under the organic material layer.

The passivation layer 180 has a plurality of contact holes 182 and 185.

A plurality of pixel electrodes 190 and a plurality of contact assistants 82 are formed on the passivation layer 180.

The pixel electrodes 190 are physically and electrically connected to the drain electrodes 175 through the contact holes 185 such that the pixel electrodes 190 receive the data voltages from the drain electrodes 175. The pixel electrodes 190, supplied with the data voltages, generate electric fields in cooperation with a common electrode (not shown) on another panel (not shown), which reorient liquid crystal molecules in a liquid crystal layer (not shown) disposed therebetween.

A pixel electrode 190 and a common electrode form a liquid crystal capacitor, which stores applied voltages after the turn-off of the TFT. An additional capacitor called a "storage capacitor" is connected in parallel to the liquid crystal capacitor. The storage capacitors are implemented by overlapping the pixel electrodes 190 with the storage lines 131. The storage electrode lines 131 are supplied with a predetermined voltage such as the common voltage. The storage electrode lines 131 may be omitted if the storage capacitance generated by the overlapping of the gate lines 121 and the pixel electrodes 190 is sufficient. The storage electrode lines 131 may be formed along a boundary of the pixels to enhance an aperture ratio.

The contact assistant 82 is connected to the end portion 179 of the data line 171. The contact assistant 82 supplements the adhesion between the end portion 179 of the data line 171 and the exterior devices. In addition, the contact assistant 82 protects the end portion 179.

The method of manufacturing the TFT array panel illustrated in FIGS. 7 and 8 will be now described in detail with reference to FIGS. 9A to 14B as well as FIGS. 7 and 8.

Figure 9A:
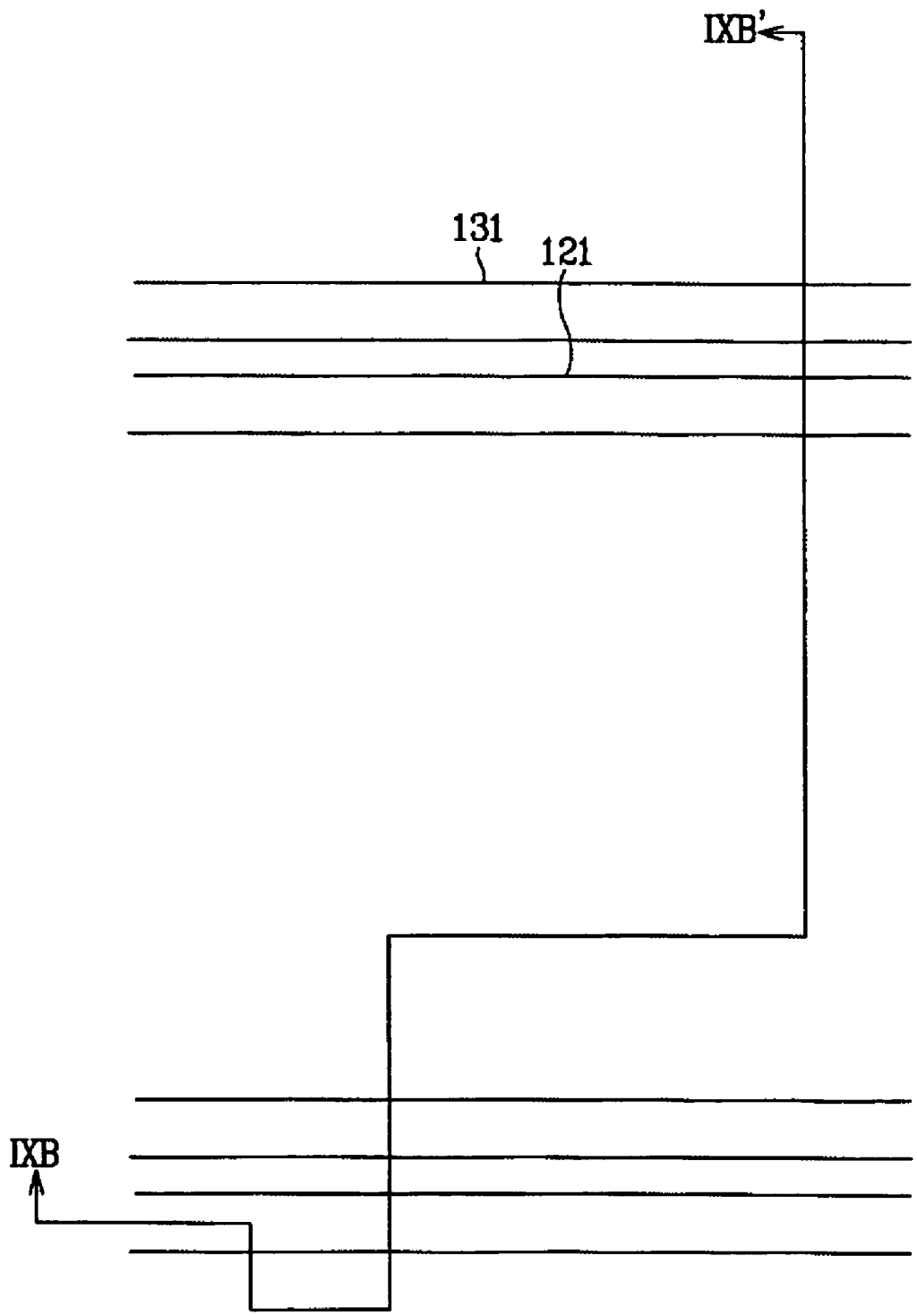
FIGS. 9A, 13A, and 14A are layout views sequentially illustrating the intermediate steps of a method of manufacturing a TFT array panel for an LCD according to the embodiment of FIGS. 7 and 8.
Figure 9B:
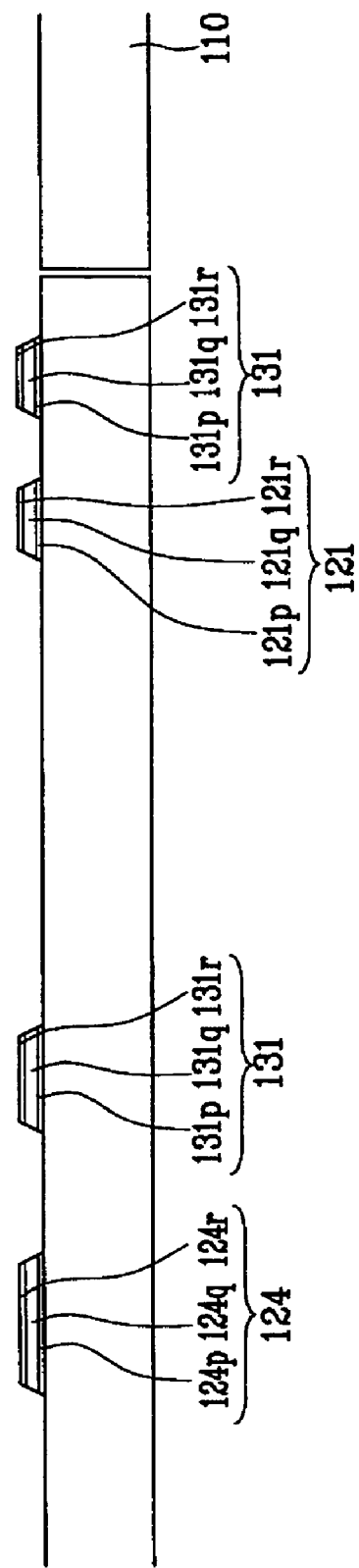
FIG. 9B is a sectional view of the TFT array panel shown in FIG. 9A taken along the line IXb-IXb'.
Figure 10:
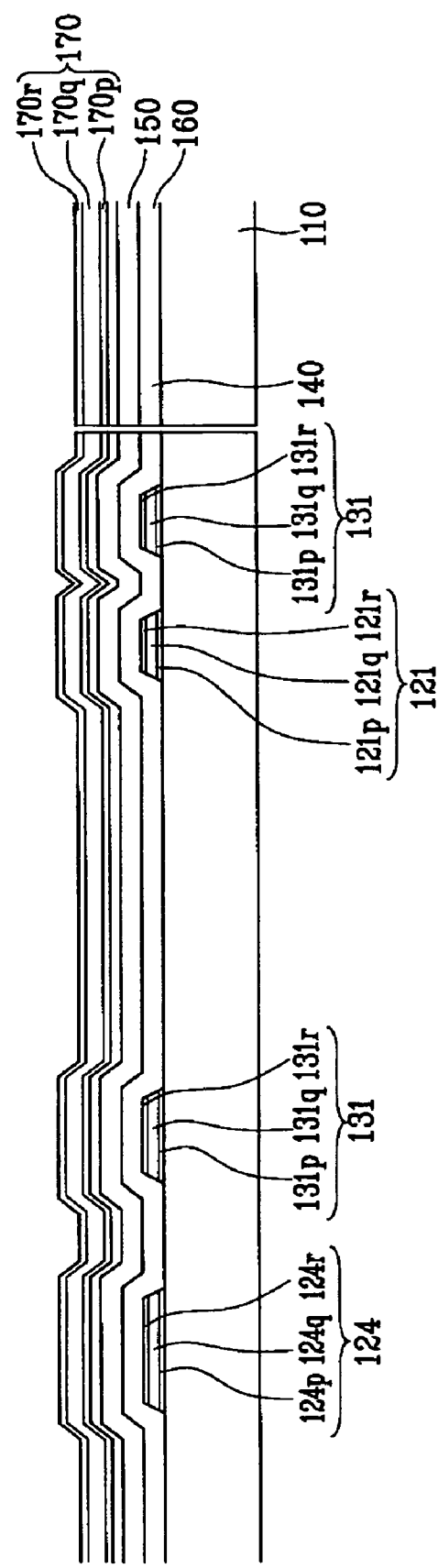
FIG. 10 is a sectional view of the TFT array panel in the step following the step shown in FIG. 9B.
Figure 11:
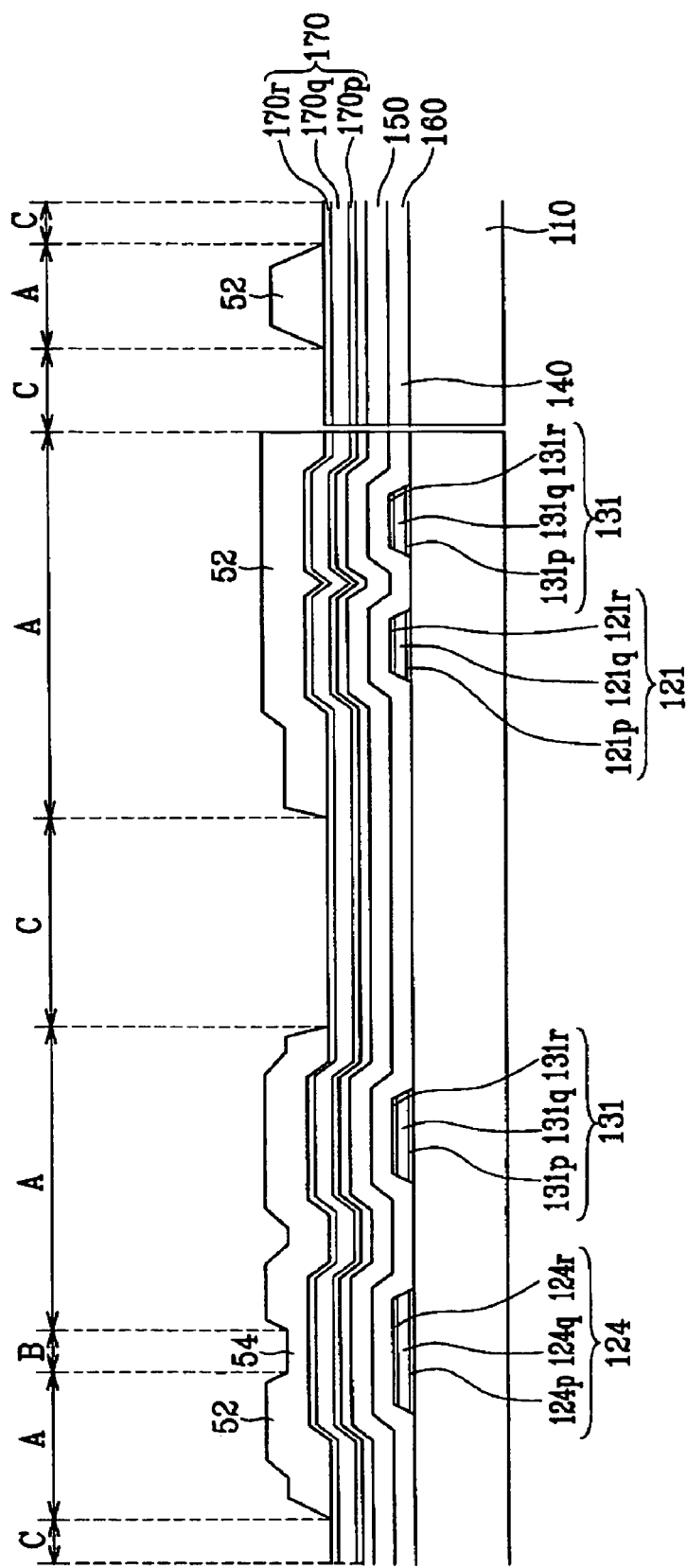
FIG. 11 is a sectional view of the TFT array panel in the step following the step shown in FIG. 10.
Figure 12:
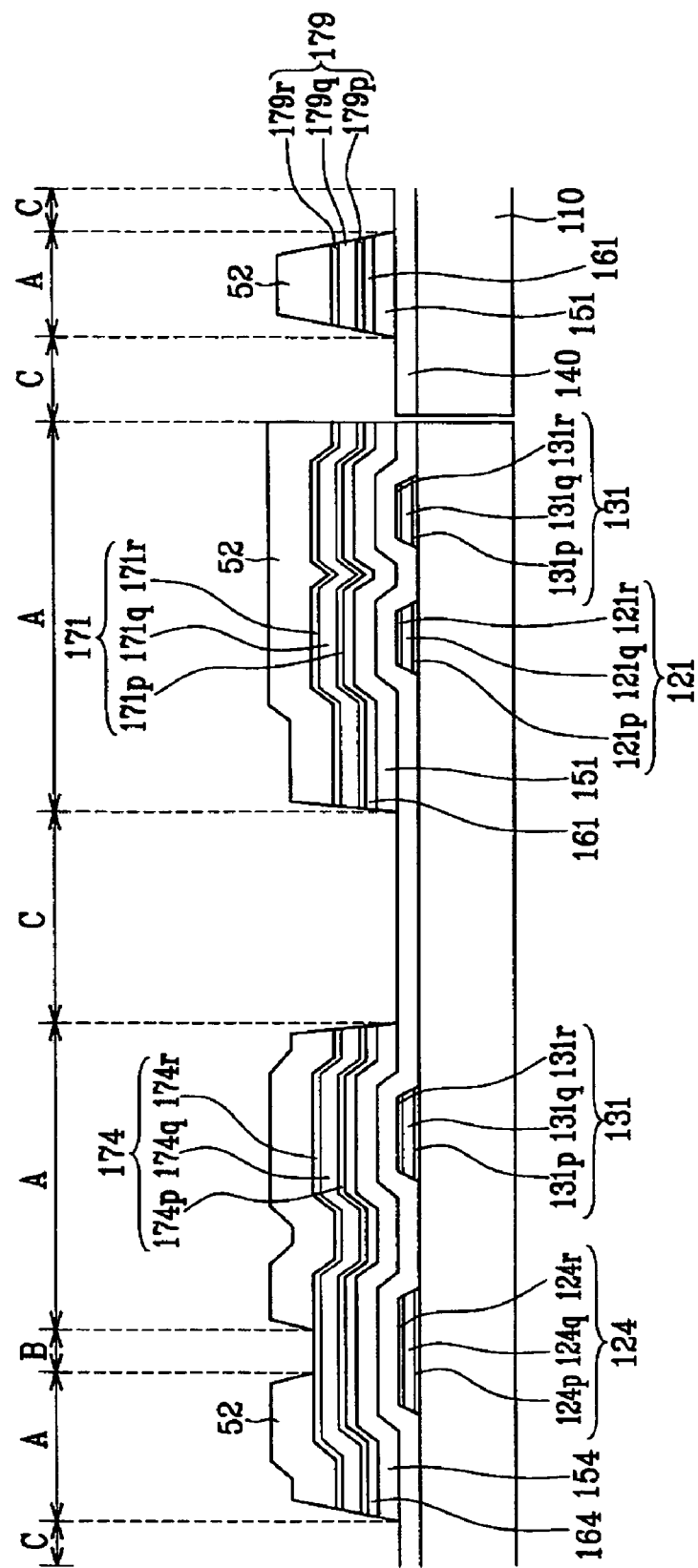
FIG. 12 is a sectional view of the TFT array panel in the step following the step shown in FIG. 11.
Figure 13A:
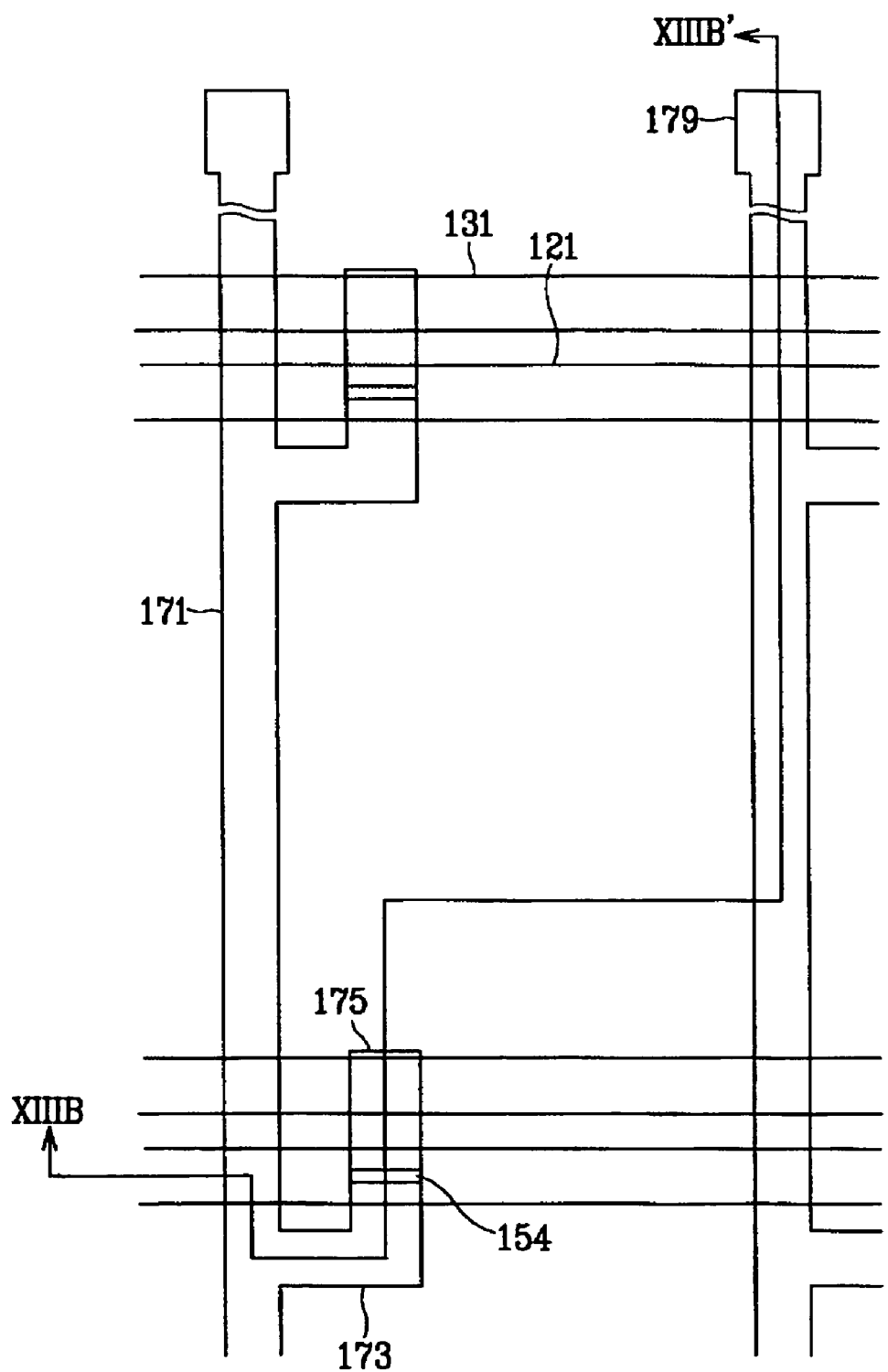
Figure 14A:
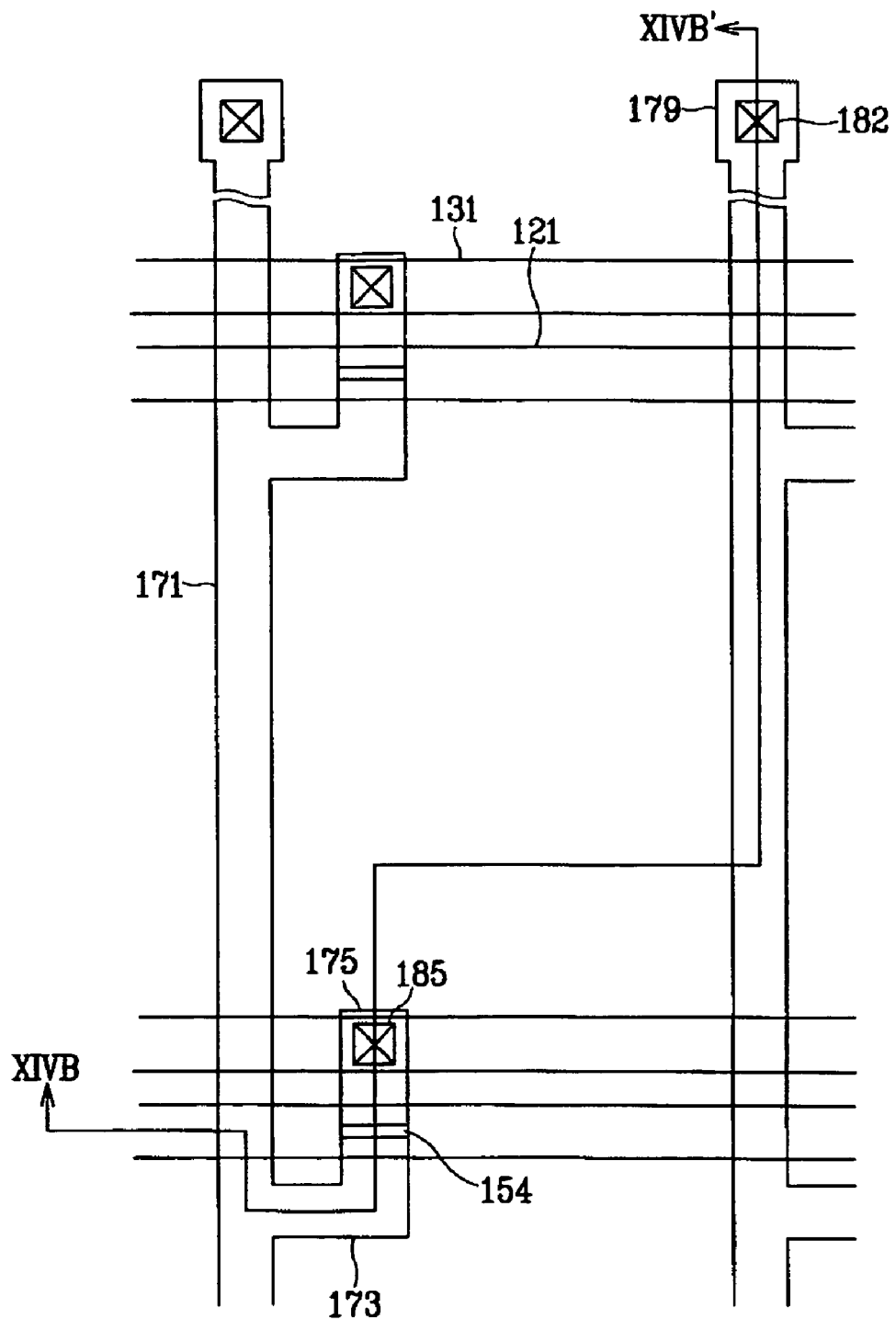
Figure 14B:
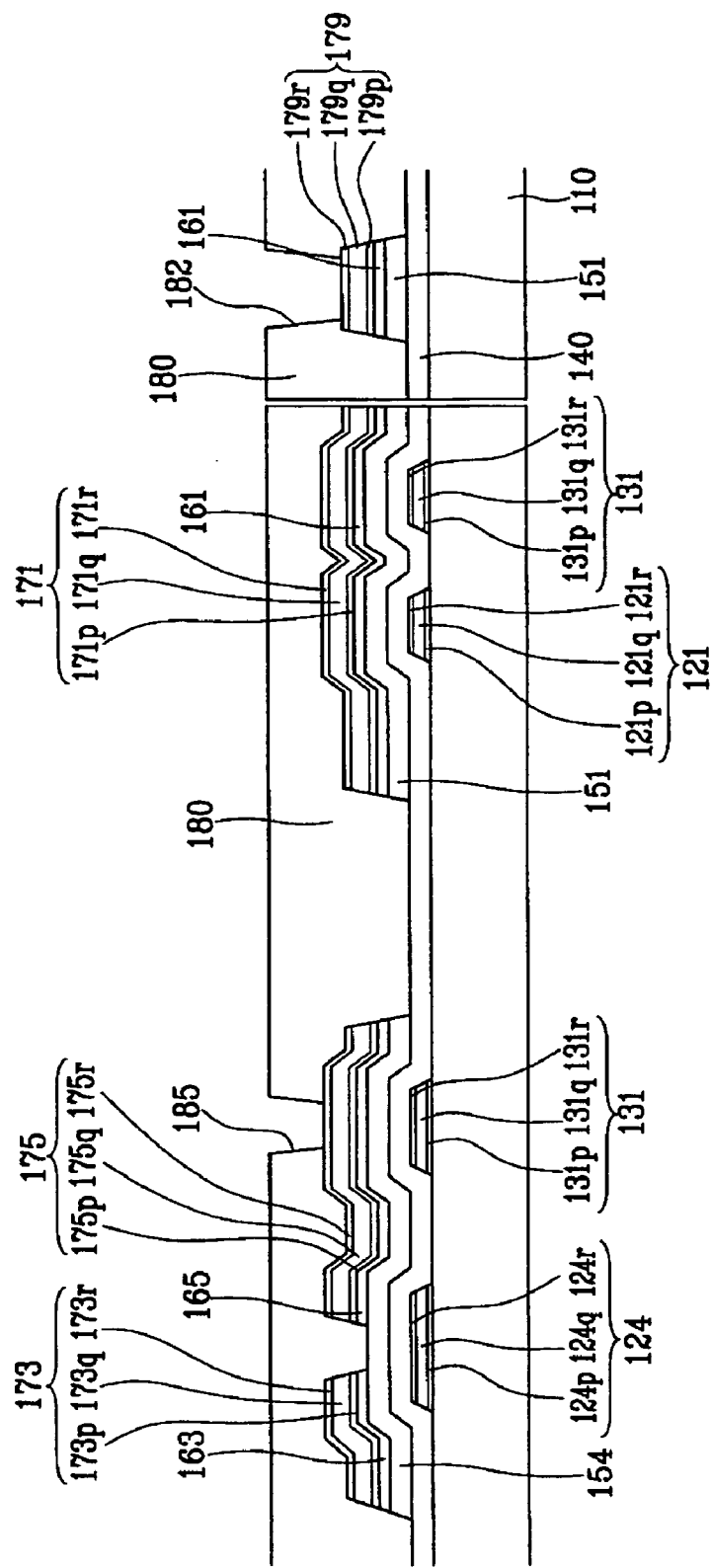
FIG. 14B is a sectional view of the TFT array panel shown in FIG. 14A taken along the line XIVb-XIVb' in the step following the step shown in FIG. 13B.

FIGS. 9A, 13A, and 14A are layout views sequentially illustrating the intermediate steps of a method of manufacturing a TFT array panel for an LCD according to the embodiment of FIGS. 7 and 8. FIG. 9B is a sectional view of the TFT array panel shown in FIG. 9A taken along the line IXb-IXb'. FIG. 10 is a sectional view of the TFT array panel in the step following the step shown in FIG. 9B. FIG. 11 is a sectional view of the TFT array panel in the step following the step shown in FIG. 10. FIG. 12 is a sectional view of the TFT array panel in the step following the step shown in FIG. 11. FIG. 13B is a sectional view of the TFT array panel shown in FIG. 13A taken along the line XIIIb-XIIIb' in the step following the step shown in FIG. 12. FIG. 14B is a sectional view of the TFT array panel shown in FIG. 14A taken along the line XIVb-XIVb' in the step following the step shown in FIG. 13B.

A first layer of Mo-containing conductor, a second layer of a Cu-containing conductor and a third layer of a MoN-containing conductor are deposited on an insulating substrate 110.

The first to third layers are deposited by co-sputtering. Two targets are positioned in the same sputtering chamber for the co-sputtering. One target is made of a Mo-containing conductor such as Mo or Mo-alloy. The other target is made of Cu-containing conductor such as Cu or Cu-alloy. The co-sputtering is performed as follows.

At first, power is applied to the Mo target while no power is applied to the Cu target, so that a Mo layer can be deposited. The Mo layer has a thickness of about 50 to about 500 Å, preferably about 100 to about 300 Å.

When the Mo layer is thinner than 50 Å, the Cu layer may directly contact the substrate 110 to degrade the adhesiveness. When the Mo layer is thicker than 500 Å, it may increase the resistance.

Next, power is switched to be applied to the Cu target and not to the Mo target, so that a Cu layer can be deposited. The Cu layer has a thickness in a range from about 1,000 to 3,000 Å, preferably about 1,500 to about 2,500 Å.

Next, power is switched again to be applied to the Mo target and not to the Cu target, so that a MoN layer can be deposited. The sputtering is performed while applying nitrogen gas ($N_2$), nitrous oxide ($N_2O$), or ammonia ($NH_3$). The MoN layer has a thickness of about 50 to about 2000 Å, preferably about 100 to about 500 Å.

When the MoN layer is thinner than 50 Å, the role of MoN layer as a capping layer may not be well-served. On the other hand, when the MoN layer is thicker than 2,000 Å, it may increase the contact resistance.

The Mo layer is disposed between a Cu layer and a substrate to enhance the adhesiveness between the Cu layer and the substrate. Thus, the Mo layer may prevent the Cu layer from peeling and lifting.

The MoN layer is disposed on the Cu layer as a capping layer to protect the Cu layer from chemicals such as etchants. Accordingly, the MoN layer prevents the Cu layer from being oxidized or polluted by organic particles.

Furthermore, the MoN layer blocks Cu diffusion to upper layers such as a gate insulating layer 140.

The MoN layer prevents oxidation of the Cu layer at their interface due to the effect of nitrogen.

Then, the photoresist is coated on the MoN layer and is illuminated through a photo-mask. Next, the illuminated photoresist is developed.

The MoN layer, the Cu layer, and the Mo layer are simultaneously etched to form a plurality of gate lines 121 with an etchant. The etchant is preferably a weak acid such as hydrogen peroxide (H2O2) since Cu is rapidly etched with an acid.

Generally, since Cu adheres poorly to a substrate or other layer, a Cu layer is easily lifted or peeled. Also, since Cu has a weak chemical resistance, a Cu layer may easily get damaged from etchants or photoresist stripper. Accordingly, a single Cu layer is not suitable for a signal line.

In the present invention, to solve the above mentioned problems, additional layers of other conductors are applied on and/or under the Cu layer. However, when additional layers are applied, additional etching processes may be required due to a differential of etching speeds between the Cu layer and the additional layers. Accordingly, it is preferable that the additional layer contain a material that can be etched along with the Cu layer with the same etchant while efficiently preventing oxidation of the Cu layer.

In the present invention, to comply with the above mentioned conditions, a Mo layer and a MoN layer are respectively applied on and under the Cu layer.

FIG. 15A is a picture illustrating the profile of a triple-layered structure including a Mo layer, a Cu layer, and a Mo layer. FIG. 15B is a picture illustrating the profile of a triple-layered structure including a MoN layer, a Cu layer, and a MoN layer. FIG. 15C is a picture illustrating the profile of triple-layered structure including a Mo layer, a Cu layer, and a MoN layer.

FIG. 15A demonstrates that the patterning of the triple layers of Mo, Cu, and Mo resulted in an inferior profile. The resulting profile does not allow the pattern to be distinguished. Accordingly, measurements of the inclination angle and the critical dimension (CD) of the pattern are not available.

FIG. 15B demonstrates that when the triple layers of MoN, Cu, and MoN are patterned, a MoN tail 1 of the lower MoN layer is formed due to discrepancies in the etching speeds of the different layers. Accordingly, the measurements for the inclination angle and the critical dimension (CD) of the pattern are not available.

FIG. 15C, the triple layers of Mo, Cu, and MoN are patterned to form a good profile. The inclination angle is about 35 to 45 degrees and has a CD skew of 1.5 to 2.0 µm.

As described above, a Mo layer and a MoN layer respectively disposed under and on a Cu layer to form signal lines having a good profile when etched simultaneously.

Referring to FIGS. 9A and 9B, the first to third layers are patterned in sequence by photo-etching with a photoresist pattern to form a plurality of gate lines 121, including a plurality of gate electrodes 124, and a plurality of storage electrode lines 131.

Referring to FIG. 10, a gate insulating layer 140 made of SiNx, an intrinsic semiconductor layer 150, and an extrinsic semiconductor layer 160 are sequentially deposited. The intrinsic semiconductor layer 150 is preferably made of hydrogenated amorphous silicon (herein referred to as "a-Si") and the extrinsic semiconductor layer 160 is preferably made of silicide or n+ hydrogenated a-Si heavily doped with n-type impurity.

Next, a first layer 170p of Mo, a second layer 170q of Cu, and a third layer 170r of MoN are sequentially deposited on the extrinsic semiconductor layer 160.

The first to third layers 170p, 170q, and 170r are deposited by co-sputtering. Two targets are installed in a same sputtering chamber for the co-sputtering. One target is made of a Mo-containing conductor such as Mo or a Mo-alloy. The other target is made of Cu-containing conductor such as Cu or a Cu-alloy.

The co-sputtering is performed as follows.

At first, power is applied to the Mo target while no power is applied to the Cu target to deposit the Mo layer 170p. The Mo layer 170p has a thickness of about 50 to about 500 Å, preferably about 100 to about 300 Å.

When the Mo layer 170p is thinner than 50 Å, the Cu layer 170q may directly contact the layers underneath it to degrade the adhesiveness. on the other hand, when the Mo layer 170p is thicker than 500 Å, it may increase the resistance.

Next, power is switched to be applied to the Cu target and not to the Mo target, so that a Cu layer 170q can be deposited. The Cu layer 170q has a thickness of about 1,000 to about 3,000 Å, preferably about 1,500 to about 2,500 Å.

Next, power is switched again to be applied to the Mo target and not to the Cu target to deposit the MoN layer 170r. The sputtering is performed while applying nitrogen gas ($N_2$), nitrous oxide ($N_2O$), or ammonia ($NH_3$). The MoN layer 170r has a thickness of about 50 to about 2000 Å, preferably about 100 to about 500 Å.

When the MoN layer 170r is thinner than 50 Å, the role of the MoN layer 170r as a capping layer may not be well-served. When the MoN layer 170r has a thickness greater than 2,000 Å, it may increase the contact resistance.

A photoresist film is coated on the third layer 170r. The photoresist film is exposed to light through an exposure mask (not shown), and developed such that the developed photoresist has a position-dependent thickness as shown in FIG. 11. The developed photoresist includes a plurality of first to third portions 54 and 52. The first portions 54 are located on channel areas B and the second portions 52 are located on the data line areas A. No reference numeral is assigned to the third portions located on the remaining areas C since they have substantially zero thickness. Here, the thickness ratio of the first portions 54 to the second portions 52 is adjusted depending upon the process conditions in the subsequent process steps. It is preferable that the thickness of the first portions 54 is equal to or less than half of the thickness of the second portions 52.

The position-dependent thickness of the photoresist is obtained by several techniques, for example, by providing translucent areas on the exposure mask as well as transparent areas and light blocking opaque areas. The translucent areas may have a slit pattern, a lattice pattern, a thin film(s) with intermediate transmittance or intermediate thickness. When using a slit pattern, it is preferable that the width of the slits or the distance between the slits is smaller than the resolution of a light exposer used for the photolithography. Another example is to use reflowable photoresist. In detail, once a photoresist pattern made of a reflowable material is formed by using a normal exposure mask only with transparent areas and opaque areas, it is subject to a reflow process to flow onto areas without the photoresist, thereby forming thin portions.

Next, the photoresist film 52 and 54 and the underlying layers are etched such that the data lines 171, drain electrodes 175, and the underlying layers are left on the data areas A, only the intrinsic semiconductor layer is left on the channel areas B, and the gate insulating layer 140 is exposed on the remaining areas C.

A method of forming such a structure will be now described.

Referring to FIG. 12, the exposed portions of the first to third layers 170p, 170q, and 170r on the other areas C are removed to expose the underlying portions of the extrinsic semiconductor layer 160.

Next, referring to FIG. 12, the exposed portions of the extrinsic semiconductor layer 160 and the underlying portions of the intrinsic semiconductor layer 150 on the areas C as well as the photoresist pattern 54 and 52 are removed by dry etching to expose S/D metals 174 of the areas B.

The photoresist pattern 54 of the channel areas B may be removed simultaneously with portions of the extrinsic semiconductor layer 160, the intrinsic semiconductor layer 150, and the photoresist patterns 52, 54. Alternatively, this removal may occur during a separate etching process. Residual photoresist of the photoresist pattern 54 in the channel area B is removed by ashing. During ashing, the semiconductor strips 151 are completely formed.

Next, as shown in FIGS. 13A and 13B, portions of the S/D metals 174 and the underlying portions of the extrinsic semiconductor layer 164 on the channel areas B are etched to be removed. At this time, the exposed portions of the semiconductor 154 may be etched to have a reduced thickness and the second portion 52 of the photoresist pattern may also be partially removed.

Accordingly, the source electrodes 173 and the drain electrodes 175 are separated from each other, and, simultaneously, the data lines and the ohmic contacts 163 and 165 are completed.

Finally, the residual second portions 52 of the photoresist pattern left on the data areas A are removed.

Thereafter, as shown in FIGS. 14A and 14B, a passivation layer 180 is formed to cover the data lines 171, the drain electrodes 175, and the exposed portions of the semiconductor stripes 151, which are not covered with the data lines 171 and the drain electrodes 175. The passivation layer 180 is preferably made of a photosensitive organic material having good flatness characteristics, a dielectric insulating material having a low dielectric constant under 4.0 (such as a-Si:C:O and a-Si:O:F) formed by plasma enhanced chemical vapor deposition (PECVD), or an inorganic material (such as silicon nitride and silicon oxide).

Next, the passivation layer 180 is photo-etched to form a plurality of contact holes 185 and 182. When the passivation layer 180 is made of a photosensitive material, the contact holes 185 and 182 may be formed only by photolithography.

Finally, as shown in FIGS. 7 and 8, a plurality of pixel electrodes 190 and a plurality of contact assistants 82 are formed by sputtering and photo-etching an IZO layer or an ITO layer. The pixel electrodes 190 and the contact assistants 82 are respectively connected to the drain electrodes 175 and an end of the data lines 171 through the contact holes 185 and 182.

In the present embodiment, both the gate lines and the data lines have a triple-layered structure that includes a Mo layer, a Cu layer, and a MoN layer. However, this is not a limitation of the invention and in some embodiments, only one of the gate lines and the data lines may have a triple layered structure.

In the present invention, a Mo layer is disposed under a Cu layer to enhance the adhesiveness between the Cu layer and lower layers (such as a substrate or ohmic contacts) to prevent the Cu layer from peeling and lifting and to block Cu diffusion to the lower layers.

The MoN layer is disposed on the Cu layer as a capping layer to protect the Cu layer from chemicals such as etchants. Accordingly, the MoN layer prevents the Cu layer from being oxidized or polluted by organic particles.

As a result, TFT array panels having signal lines which have low resistance and reliability are achieved.

Although preferred embodiments of the present invention have been described in detail hereinabove, it should be clearly understood that many variations and/or modifications of the basic inventive concepts herein taught, which may appear to those skilled in the present art, will still fall within the spirit and scope of the present invention, as defined in the appended claims.

What is claimed is:

1. A signal line comprising:
    a first conductive layer made of a Mo-containing conductor;
    a second conductive layer of a Cu-containing conductor; and
    a third conductive layer made of a MoN-containing conductor,
    wherein the second conductive layer is disposed on the first conductive layer, and the third conductive layer is disposed on the second conductive layer.

2. The signal line of claim 1, wherein the signal line is a gate line or a data line of a thin film transistor array panel.

3. The signal line of claim 1, wherein the second conductive layer is made of pure Cu or a Cu-alloy.

4. The signal line of claim 1, wherein the first conductive layer has a thickness of 50 to 500 Å, the second conductive layer has a thickness of 1000 to 3000 Å, and the third conductive layer has a thickness of 50 to 2000 Å.

5. The signal line of claim 1, wherein the signal line has tapered edges, and the inclination angles of the edges are about 30-80 degrees.

6. A thin film transistor array panel comprising:
   an insulating substrate;
   a gate line formed on the insulating substrate;
   a gate insulating layer formed on the gate line;
   a drain electrode and a data line having a source electrode formed on the gate insulating layer, the drain electrode being separated from the source electrode; and
   a pixel electrode connected to the drain electrode, wherein the gate line and the data line and drain electrode include a first conductive layer made of a Mo-containing conductor, a second conductive layer made of a Cu-containing conductor, and a third conductive layer made of a MoN-containing conductor, wherein the second conductive layer is disposed on the first conductive layer, and the third conductive layer is disposed on the second conductive layer.

7. The thin film transistor array panel of claim 6, wherein the first conductive layer has a thickness of 50 to 500 Å, the second conductive layer has a thickness of 1000 to 3000 Å, and the third conductive layer has a thickness of 50 to 2000 Å.

8. The thin film transistor array panel of claim 6, wherein the gate line and the data line and drain electrode have tapered edges, and the inclination angles of the edges are about 30-80 degrees.

* * * * *